(12) United States Patent
Yang

(10) Patent No.: US 7,031,896 B1
(45) Date of Patent: Apr. 18, 2006

(54) METHODS FOR PERFORMING GENERALIZED TRAJECTORY EVALUATION

(75) Inventor: Jin Yang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 843 days.

(21) Appl. No.: 09/608,856

(22) Filed: Jun. 30, 2000

(51) Int. Cl.
*G06F 17/50* (2006.01)
*G06G 7/62* (2006.01)

(52) U.S. Cl. .............................. 703/13; 703/22; 703/2; 716/4

(58) Field of Classification Search .................... 703/2, 703/13–14, 22; 716/4
See application file for complete search history.

(56) References Cited

U.S. PATENT DOCUMENTS

| | | | |
|---|---|---|---|
| 5,119,318 | A | 6/1992 | Paradies et al. |
| 5,469,367 | A | 11/1995 | Puri et al. |
| 5,481,717 | A | 1/1996 | Gaboury |
| 5,491,639 | A | 2/1996 | Filkorn |
| 5,594,656 | A | 1/1997 | Tamisier |
| 5,691,925 | A | 11/1997 | Hardin et al. |
| 5,754,454 | A | 5/1998 | Pixley et al. |
| 5,768,498 | A | 6/1998 | Boigelot et al. |
| 5,870,590 | A | 2/1999 | Kita et al. |
| 5,905,977 | A | 5/1999 | Goubault |
| 5,937,183 | A | 8/1999 | Ashar et al. |
| 6,026,222 | A | 2/2000 | Gupta et al. |
| 6,035,109 | A | 3/2000 | Ashar et al. |
| 6,086,626 | A | 7/2000 | Jain et al. |
| 6,131,078 | A | 10/2000 | Plaisted |
| 6,148,436 | A | 11/2000 | Wohl |
| 6,185,516 | B1 | 2/2001 | Hardin et al. |
| 6,209,120 | B1 | 3/2001 | Kurshan et al. |

(Continued)

OTHER PUBLICATIONS

Sipma et al, "Deductive Model Checking," Formal Methods in System Design, vol. 15, pp. 49-74 (1999) (text available at http://www-step.stanford.edu/papers/fmsd99.pdf).*

(Continued)

*Primary Examiner*—Samuel Broda
(74) *Attorney, Agent, or Firm*—Larry M. Mennemeier

(57) ABSTRACT

Methods for formal verification of circuits and other finite-state systems are disclosed. Formal definitions and semantics are disclosed for a model of a finite-state system, an assertion graph to express properties for verification, and satisfiability criteria for specification and automated verification of forward implication properties and backward justification properties. A method is disclosed to perform antecedent strengthening on antecedent labels of an assertion graph.

A method is also disclosed to compute a simulation relation sequence ending with a simulation relation fixpoint, which can be compared to a consequence labeling for each edge of an assertion graph to verify implication properties properties according to the formal semantics. An alternative method is disclosed to compute the simulation relation sequence from the strengthened antecedent labels of an assertion graph, thereby permitting automated formal verification of justification properties.

Finally methods are disclosed to significantly reduce computation through abstraction of models and assertion graphs and to compute an implicit satisfiability of an assertion graph by a model from the simulation relation computed for the model and assertion graph abstractions. Other methods and techniques are also disclosed herein, which provide for fuller utilization of the claimed subject matter.

25 Claims, 18 Drawing Sheets

U.S. PATENT DOCUMENTS

| | | | |
|---|---|---|---|
| 6,247,165 B1 | 6/2001 | Wohl et al. |
| 6,292,916 B1 | 9/2001 | Abramovici et al. |
| 6,301,687 B1 | 10/2001 | Jain et al. |
| 6,308,299 B1 | 10/2001 | Burch et al. |
| 6,321,186 B1 | 11/2001 | Yuan et al. |
| 6,339,837 B1 | 1/2002 | Li |
| 6,341,367 B1 | 1/2002 | Downing |
| 6,484,134 B1 | 11/2002 | Hoskote |

OTHER PUBLICATIONS

Aagaard et al, "Formal Verification Using Parametric Representation of Boolean Constraints," Proceedings of the 36th ACM/IEEE Conference on Design Automation, pp. 402-407 (Jun. 1999).*

Aagaard et al, "Combining Theorem Proving and Trajectory Evaluation in an Industrial Environment," Proceedings of the Design Automation Conference, pp. 538-541 (Jun. 1998).*

Berezin, S. et al, "A Compositional Proof System for the Modal µ-Calculus and CCS," *Technical Report CMU-CS-97-105, Carnegie Mellon University*, Jan. 15, 1997.

Berezin, S. et al, "Model Checking Algorithms for the µ-Calculus," *Technical Report CMU-CS-96-180, Carnegie Mellon University*, Sep. 23, 1996.

Bryant, R. E. et al, "Formal Hardware Verification by Symbolic Ternary Trajectory Evaluation," $28^{th}$ *ACM/IEEE Design Automation Conference*, Paper 24.2, 1991, pp. 397-402.

Bryant, R. E., "Binary Decision Diagrams & Beyond," Tutorial at ICCAD '95, *Carnegie Mellon University*, 1995.

Burch, J. R. et al, "Representing Circuits More Efficiently in Symbolic Model Checking," $28^{th}$ *ACM/IEEE Design Automation Conference*, Paper 24.3, 1991, pp. 403-407.

Burch, J. R. et al, "Sequential Circuit Verification Using Symbolic Model Checking," $27^{th}$ *ACM/IEEE Design Automation Conference*, Paper 3.2, 1990, pp. 46-51.

Campos, S., "Real-Time Symbolic Model Checking for Discrete Time Models," *Technical Report CMU-CS-94-146, Carnegie Mellon University, Pittsburgh, PA*, May 2, 1994.

Chan, W. et al, Combining Constraint Solving and Symbolic Model Checking for a Class of Systems with Non-linear Constraints, *Computer Aided Verification, $9^{th}$ International Conference, CAV '97 Proceedings* (O. Grumberg, Editor), Lecture Notes in Computer Science 1254, pp. 316-327, Haifa, Israel, Jun. 1997. Springer-Verlag (Revised in Dec. '98).

Chen, Y. et al, "PBHD: An Efficient Graph Representation for Floating Point Circuit Verification," *Technical Report CMU-CS-97-134, Carnegie Mellon University*, May 1997.

Cheung, S. et al, "Checking Safety Properties Using Compositional Reachability : Analysis," *ACM Transactions on Software Engineering and Methodology*, vol. 8, No. 1, Jan. 1999, pp. 49-78.

Chiodo, M. et al, "Automatic Compositional Minimization in CTL Model Checking," *Proceedings of 1992 IEEE/ACM International Conference on Computer-Aided Design*, Nov., 1992, pp. 172-178.

Chou, C., "The Mathematical Foundation of Symbolic Trajectory Evaluation," *International Conference on Computer-Aided Verification(CAV'99)*, Trento, Italy, Jul. 1999 pp. 196-207, Proceedings of CAV'99, Lecture Notes in Computer Science #1633 (Editors: Nicolas Halbwachs & Doron Peled), Springer-Verlog, 1999.

Clarke, E. et al, "Another Look at LTL Model Checking," *Technical Report CMU-CS-94-114, Carnegie Mellon University*, Feb. 23, 1994.

Clarke, E. et al, "Combining Symbolic Computation and Theorem Proving: Some Problems of Ramanujan," *Technical Report CMU-CS-94-103, Carnegie Mellon University*, Jan. 1994.

Clarke, E. M. et al, "Formal Methods: State of the Art and Future Directions," *ACM Computing Surveys*, vol. 28, No. 4, Dec. 1996, pp. 626-643.

Clarke, E. M. et al, "Model Checking and Abstraction," *Proceedings of the $19^{th}$ ACM SIGPLAN-SIGACT Symposium on Principles of Programming Languages*, Feb. 1992, pp. 343-354.

Clarke, E. M. et al, "Model Checking and Abstraction," *ACM Transactions on Programming Languages and Systems*, vol. 16, No. 5, Sep. 1994, pp. 1512-1542.

Grumberg, O., "Model Checking and Modular Verification," *ACM Transactions On Programming Languages and Systems*, vol. 16, No. 3, May 1994, pp. 843-871.

Jackson, D., "Exploiting Symmetry in the Model Checking of Relational Specifications," *Technical Report CMU-CS 94-219, Carnegie Mellon University*, Dec. 1994.

Jain, A. et al, "Verifying Nondeterministic Implementations of Determinist Systems," *Lecture Notes in Computer Science, Formal Methods in Computer Aided-Design*, pp. 109-125, Nov. 1996.

Jain, A., "Formal Hardware Verification by Symbolic Trajectory Evaluation," *Carnegie Mellon University Ph.D. Dissertation*, Jul. 1997.

Jain, S. et al, "Automatic Clock Abstraction from Sequential Circuits," *Proceedings of the $32^{nd}$ ACM/IEEE Conference on Design Automation*, Jan. 1995.

Jha, S. et al, "Equivalence Checking Using Abstract BBDs," *Technical Report CMU-CS-96-187, Carnegie Mellon University, Pittsburgh, PA*, Oct. 29, 1996.

Kern, C. et al, "Formal Verification In Hardware Design: A Survey," *ACM Transactions on Design Automation of Electronic Systems*, vol. 4, No. 2, Apr. 1999, pp. 123-193.

Kurshan, R. et al, "Verifying Hardware in its Software Context," *Proceedings of the $19^{th}$ ACM SIGPLAN-SIGACT Symposium on Principles of Programming Languages*, Feb. 1992, pp. 742-749.

Nelson, K. L. et al, "Formal Verification of a Superscalar Execution Unit," $34^{th}$ *Design Automation Conference*, Jun. 1997.

Tuya, J. et al, "Using a Symbolic Model Checker for Verify Safety Properties in SA/RT Models," *Proceeding of the 5h European Software Engineering Conference, Lecture Notes in Computer Science*, vol. 989, Springer-Verlag, Berlin, 1995, pp. 59-75.

Velev, M. N., "Efficient Modeling of Memory Arrays in Symbolic Simulations," *Proceedings of Computer-Aided Verification*, Jun. 1997.

Wing, J. M. et al, "A Case Study in Model Checking Software Systems," *Technical Report CMU-CS-96-124, Carnegie Mellon University, Pittsburgh, PA*, Apr. 1996.

Yeh, W. et al, "Compositional Reachability Analysis Using Process Algebra," $28^{th}$ *ACM/IEEE Design Automation Conference*, 1991.

Bradley, J., et al., "Compositional BDD Construction: A Lazy Algorithm," Department of Computer Science, University of Bristol, UK, Apr. 6, 1998.

Burch, E. M., et al., "Symbolic Model Checking for Sequential Circuit Verification," *IEEE Transactions on*

*Computer-Aided Design of Integrated Circuits and Systems*, vol. 13, Issue 4, Apr. 1994, pp. 401-424.

Campos, S.V.A., "Symbolic Model Checking in Practice," *XII Symposium on Integrated Circuits and Systems Design, 1999 Natal, Brazil—IEEE*, Sep. 1999, pp. 98-101.

Hojati, R., et al., "Early Quantification and Partitioned Transition Relations," *1999 IEEE International Conference on Computer Design: VLSI in Computers and Processors, 1996, ICCD '96 Proceedings—Austin, TX*, Oct., 1996, pp. 12-19.

Zhang, Zhang, "An Apprpoach to Hierarchy Model Checking via Evaluating CTL Hierarchically," *Proceedings of the Fourth Asian Test Symposium, 1995—Bangalore, India*, Nov. 1995, pp. 45-49.

* cited by examiner

METHODS FOR PERFORMING GENERALIZED TRAJECTORY EVALUATION

FIELD OF THE INVENTION

This invention relates generally to automated design verification, and in particular to formal property verification and formal equivalence verification for very large scale integrated circuit designs and other finite state systems.

BACKGROUND OF THE INVENTION

As hardware and software systems become more complex there is a growing need for automated formal verification methods. These methods are mathematically based techniques and languages that help detect and prevent design errors thereby avoiding losses in design effort and financial investment.

Examples of the type of properties being verified include safety properties (i.e. that the circuit can not enter undesirable states) and equivalence properties (i.e. that a high level model and the circuit being verified have equivalent behaviors). There are two well-established symbolic methods for automatically verifying such properties of circuits and finite state systems that are currently considered to be significant. The two most significant prior art methods are known as classical Symbolic Model Checking (SMC) and Symbolic Trajectory Evaluation (STE).

Classical SMC is more widely know and more widely received in the formal verification community. It involves building a finite model of a system as a set of states and state transitions and checking that a desired property holds in the model. An exhaustive search of all possible states of the model is performed in order to verify desired properties. The high level model can be expressed as temporal logic with the system having finite state transitions or as two automata that are compared according to some definition of equivalence. A representative of classical SMC from Carnegie Mellon University known as SMV (Symbolic Model Verifier) has been used for verifying circuit designs and protocols. Currently these techniques are being applied also to software verification.

One disadvantage associated with classical SMC is a problem known as state explosion. The state explosion problem is a failure characterized by exhaustion of computational resources because the required amount of computational resources expands according to the number of states defining the system. SMV, for example, is limited by the size of both the state space of systems and also the state space of properties being verified. Currently, classical SMC techniques are capable of verifying systems having hundreds of state encoding variables. The budget of state encoding variables must be used to describe both the high level model and the low level circuit or system. This limitation restricts classical SMC to verifying circuits up to functional unit block (FUB) levels. For systems with very much larger state spaces, SMC becomes impractical to use.

The second and less well-known technique, STE, is a lattice based model checking technique. It is more suitable for verifying properties of systems with very large state spaces (specifiable in thousands or tens of thousands of state encoding variables) because the number of variables required depends on the assertion being checked rather than on the system being verified. One significant drawback to STE lies in the specification language, which permits only a finite time period to be specified for a property.

A Generalized STE (GSTE) algorithm was proposed in a Ph.D. thesis by Alok Jain at Carnegie Mellon University in 1997. The GSTE proposed by Jain permits a class of complex safety properties with infinite time intervals to be specified and verified. One limitation to Jain's proposed GSTE is that it can only check for future possibilities based on some past and present state conditions. This capability is referred to as implication. For example, given a set of state conditions at some time, t, implication determines state conditions for time, t+1. Another, and possibly more important limitation is that the semantics of the extended specification language were not supported by rigorous theory. As a consequence few practitioners have understood and mastered the techniques required to use GSTE effectively.

BRIEF DESCRIPTION OF THE DRAWINGS

The present invention is illustrated by way of example and not limitation in the figures of the accompanying drawings.

FIG. 5b shows the fixpoint simulation relation of the antecedent strengthened assertion graph of FIG. 5a.

DETAILED DESCRIPTION

Figure 1A:
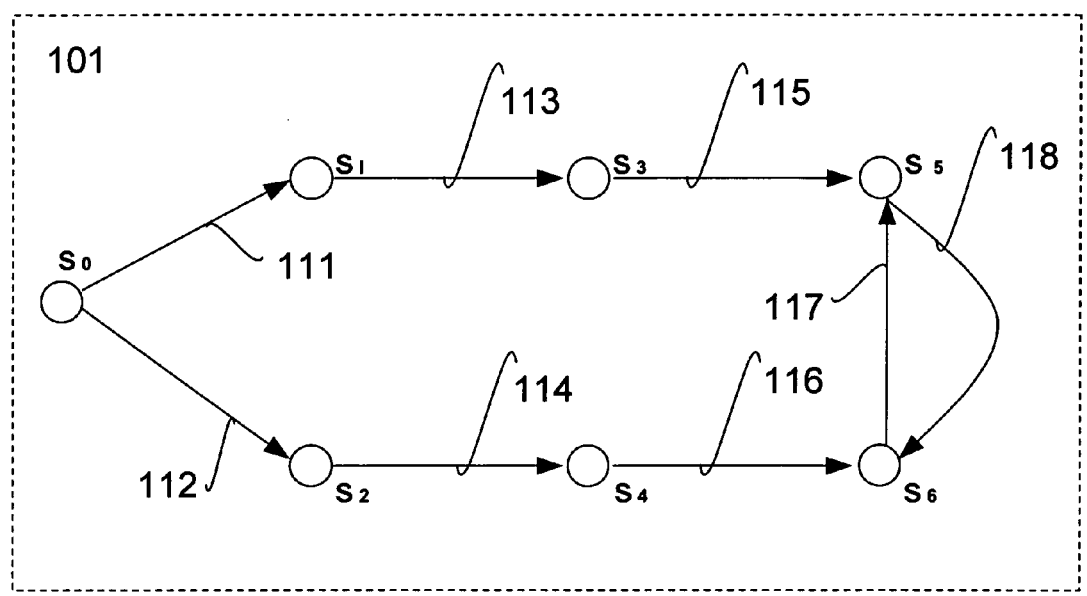
FIG. 1a shows an example of a model.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Methods for formal verification of circuits and other finite-state systems are disclosed herein. For one embodiment, formal definitions and semantics are disclosed for a model of a finite-state system, an assertion graph to express forward implication properties and backward justification properties for verification, and satisfiability criteria for automated verification of forward implication properties and backward justification properties. For one embodiment, a method is disclosed to perform antecedent strengthening on antecedent labels of an assertion graph.

For one alternative embodiment, a method is disclosed to compute a simulation relation sequence ending with a simulation relation fixpoint, which can be compared to a consequence labeling for the edges of an assertion graph to verify implication properties. For another alternative embodiment, a method is disclosed to compute the simulation relation sequence from the strengthened antecedent labels of an assertion graph, thereby permitting automated formal verification of justification properties.

For another alternative embodiment, methods are disclosed to significantly reduce computation through abstraction of models and assertion graphs and to compute an implicit satisfiability of an assertion graph by a model from the simulation relation computed for the model and assertion graph abstractions.

For another alternative embodiment, a method for representing and verifying assertion graphs symbolically is disclosed that provides an effective alternative for verifying families of properties. For another alternative embodiment, a class of lattice domains based on symbolic indexing functions is defined and a method using assertion graphs on a symbolic lattice domain to represent and verify implication properties and justification properties, provides an efficient symbolic manipulation technique using BDDs. Previously disclosed methods for antecedent strengthening, abstraction, computing simulation relations, verifying satisfiability and implicit satisfiability may also be extended to assertion graphs that are symbolically represented. Other methods and techniques are also disclosed herein, which provide for fuller utilization of the claimed subject matter.

Intuitively, a model of a circuit or other finite state system can be simulated and the behavior of the model can be verified against properties expressed in an assertion graph language. Formal semantics of the assertion graph language explain how to determine if the model satisfies the property or properties expressed by the assertion graph. Two important characteristics of this type of verification system are the expressiveness of the assertion graph language and the computational efficiency of carrying out the verification.

For one embodiment, a finite state system can be formally defined on a nonempty finite set of states, S, as a nonempty transition relation, M, where (s1, s2) is an element of the transition relation, M, if there exists a transition in the finite state system from state s1 to state s2 and both s1 and s2 are elements of S. M is called a model of the finite state system.

For another possible embodiment, an alternative definition of the model, M, can be set forth as a pair of induced transformers, Pre and Post, such that Pre({s2}) includes s1 and Post({s1}) includes s2 if (s1,s2) is an element of M. In other words, the Pre transformer identifies any states, s, in S for which there exists a transition to some state, s', in S. Pre is called a pre-image transformer. The Post transformer identifies any states, s', in S for which there exists a transition from some state, s, in S. Post is called a post-image transformer.

For one embodiment, FIG. 1a depicts a model 101, of a finite state system. Model 101 includes elements: (s0, s1) depicted by transition 111, (s0, s2) depicted by transition 112, (s1, s3) depicted by transition 113, (s2, s4) depicted by transition 114, (s3, s5) depicted by transition 115, (s4, s6) depicted by transition 116, (s6, s5) depicted by transition 117, and (s5, s6) depicted by transition 118. Alternatively, M is equal to (Pre, Post) where Pre({s0})={ }, Pre({s1})=Pre({s2})={s0}, Pre({s3})={s1}, Pre({s4})={s2}, Pre({s5})={s3, s6}, Pre({s6})={s4, s5}, Post({s0})={s1, s2}, Post({s1})={s3}, Post({s2})={s4}, Post({s3})={s5}, Post({s4})={s6}, Post({s5})={s6}, and Post({s6})={s5}. It will also be appreciated that the transformers Pre and Post may be conveniently defined over all subsets of S={s0, s1, s2, s3, s4, s5, s6}, denoted P(S), and not just the single-element subsets. For example, Pre({s5, s6})={s3, s4, s5, s6} and Post({s0, s4})={s1, s2, s6}. The transformers Pre and Post are monotonic, which means that if for some sets S1 and S2, S1 contains S2, then Pre(S1) contains Pre(S2) and Post(S1) contains Post(S2).

For one possible embodiment, a finite sequence of states of length, n, is called a finite trace, t, in the model M if it is true of every state, s, occurring in the ith position in the sequence (i being contained within the closed interval [1,n−1]) that some state, s', for which Post({s}) includes s', occurs in the i+1th position in the sequence. An infinite trace is a sequence of states, which satisfies the above conditions for all i greater or equal to 1.

For example, there are eight distinct infinite traces in the model depicted in FIG. 1:

t1=[s0, s1, s3, s5, s6, s5, . . . ],
t2=[s0, s2, s4, s6, s5, s6, . . . ],
t3=[s1, s3, s5, s6, s5, . . . ],
t4=[s2, s4, s6, s5, s6, . . . ],
t5=[s3, s5, s6, s5, . . . ],
t6=[s4, s6, s5, s6, . . . ],
t7=[s5, s6, s5, . . . ], and
t8=[s6, s5, s6, . . . ].

For one embodiment, an assertion graph, G, can be defined on a finite nonempty set of vertices, V, to include an initial vertex, vI; a set of edges, E, having one or more copies of outgoing edges originating from each vertex in V; a label mapping, Ant, which labels an edge, e, with an antecedent Ant(e); and a label mapping, Cons, which labels an edge, e, with a consequence, Cons(e). When an outgoing edge, e, originates from a vertex, v, and terminates at vertex, v', the original vertex, v, is called the head of e (written v=Head(e)) and the terminal vertex, v', is called the tail of e (written v'=Tail(e)).

Figure 1B:
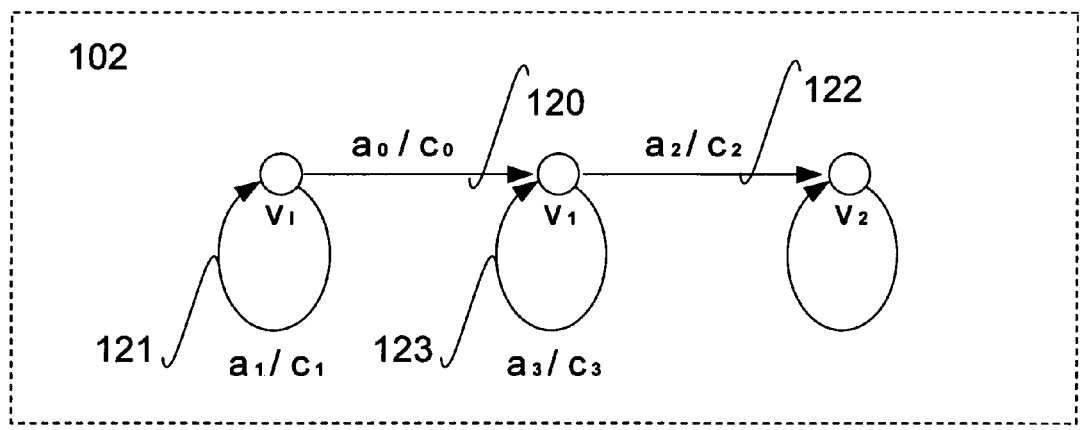
FIG. 1b shows an example of an assertion graph.

For one embodiment, FIG. 1b depicts an assertion graph, 102. The two types of labels used in the assertion graph have the following purposes: an antecedent represents a set of possible pre-existing states and stimuli to a circuit or finite state system to affect its behavior; a consequence represents a set of possible resulting states or behaviors to be checked through simulation of the circuit or finite state system. Antecedent and consequence labels are written as ai/ci for the edges of assertion graph 102. For example, from vertex vI, a corresponding system should transition according to edge 121 and produce resulting states or behaviors according to consequence c1 if stimuli and pre-existing state conditions described by antecedent a1 are met. On the other hand, the system should transition according to edge 120 and produce resulting states or behaviors according to consequence c0 if stimuli and pre-existing state conditions described by antecedent a0 are met. Similarly for vertex v1, the system should transition according to edge 122 producing consequences c2 if antecedent a2 is met or according to edge 123 producing consequences c3 if antecedent a3 is met. For vertex v2, consequences are trivially satisfied.

It will be appreciated that using an assertion graph, properties may be conveniently specified at various levels of abstraction according to the complexity of the circuit or finite state system being modeled.

Figure 1C:
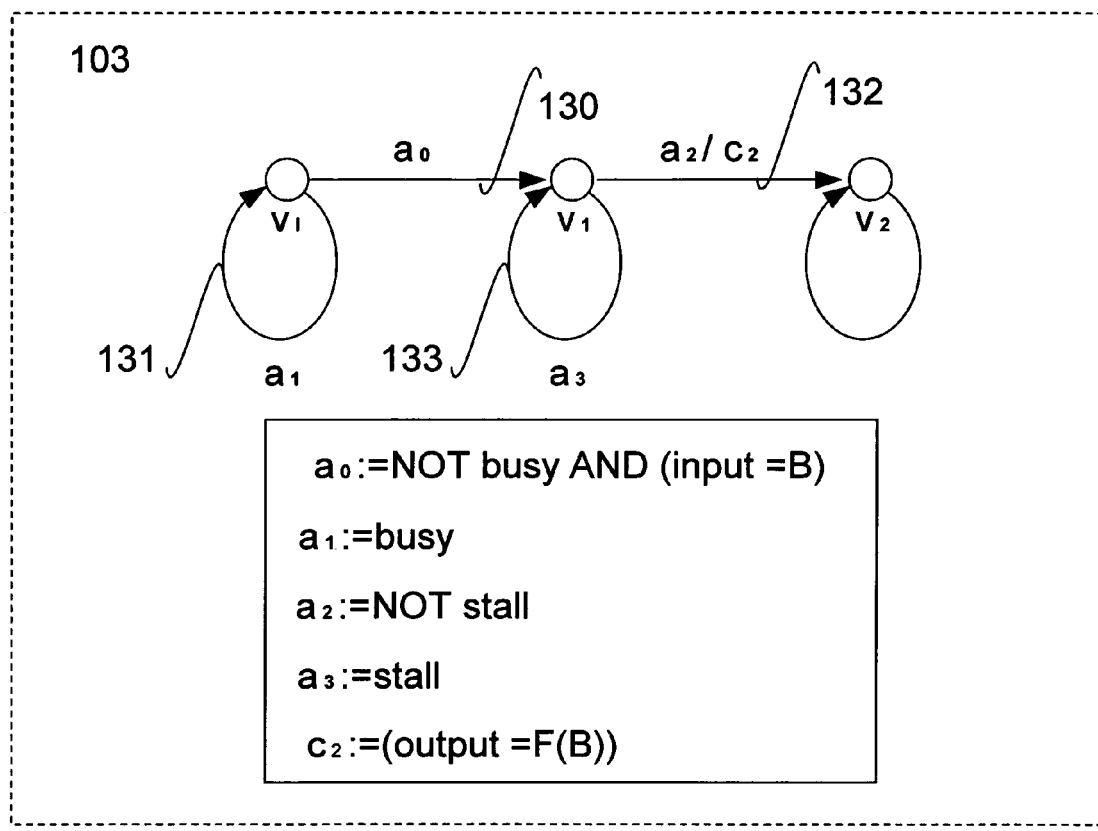
FIG. 1c shows another example assertion graph and sample antecedents and consequences with trivial antecedents and consequences omitted.

For example, using the assertion graph 102 of FIG. 1b properties can be specified at a convenient level of abstraction for some finite state system as depicted in assertion graph 103 of FIG. 1c. From vertex, vI, a corresponding circuit should transition around edge 131 if busy, or transition along edge 130 to vertex, v1, if not busy and accepting input B. From vertex v1, either the circuit is stalled in which it continues to transition along loop 133, or it produces an output along edge 132 of F(B) which is a function of the input B.

For one possible embodiment, a finite sequence of edges of length, n, is called a finite path, p, in the assertion graph G if it is true of every edge, e, occurring in the ith position in the sequence (i being contained within the closed interval [1,n–1]) that some edge, e', for which Tail(e)=Head(e'), occurs in the i+1th position in the sequence. If for the first edge, e1, in the sequence, Head(e1)=vI (the initial vertex), then the sequence is called a finite I-path. An infinite path (or infinite I-path) is a sequence of edges, which satisfies the above conditions for all i greater or equal to 1.

An I-path provides an encoding of correlated properties for a finite state system. Each property may be interpreted such that if a trace satisfies a sequence of antecedents, then it must also satisfy a corresponding sequence of consequences.

Figure 2A:
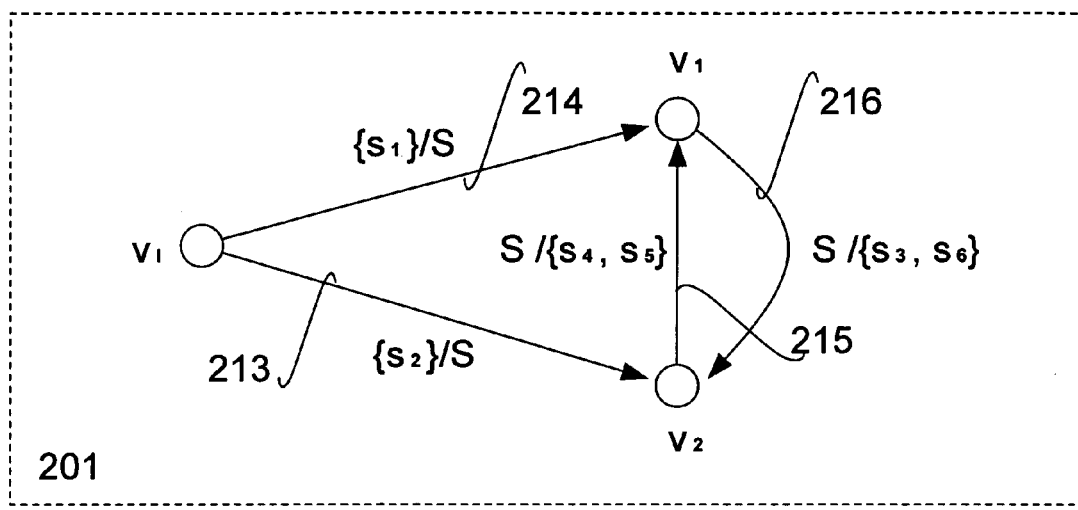
FIG. 2a shows another example of an assertion graph.

For example, the assertion graph 201 depicted in FIG. 2a describes a collection of correlated properties. The infinite I-path including edge 214, edge 216, edge 215, edge 216, . . . indicates that if the system enters state s1, then it alternates between {s3, s6} and {s4, s5}. The infinite I-path including edge 213, edge 215, edge 216, edge 215, . . . indicates that if the system enters state s2, then it alternates between {s4, s5} and {s3, s6}.

A rigorous mathematical basis for both STE and GSTE was devised by Ching-Tsun Chou of Intel Corporation in a paper entitled "The Mathematical Foundation of Symbol Trajectory Evaluation," (Proceedings of CAV'99, Lecture Notes in Computer Science #1633, Springer-Verlag, 1999, pp. 196–207). In order for practitioners to truly understand and make good use of GSTE, it is necessary to have a language semantics that is based on rigorous mathematical theory.

For one embodiment, a strong semantics for assertion graphs may be defined more formally. To say that a finite trace, t, of length n in a model, M, satisfies a finite path, p, of the same length in an assertion graph, G, under an edge labeling, L (denoted by $(M, t)\models_L(G, p)$), means that for every i in the closed interval $[1,n]$, the ith state in trace, t, is included in the set of states corresponding to the label of the ith edge in path, p. To illustrate examples of a state being included in a label set, s1 is included in the antecedent set {s1} of edge 214 in FIG. 2a, and s3 is included in the consequence set {s3, s6} of edge 216.

To say that a state, s, satisfies an edge, e, in n steps (denoted by $(M, s)\models^n(G, e)$); means that for every k-length trace prefix, $t^k$, starting from s and every k-length path prefix, $p^k$, starting from e, and for every k less than or equal to n, trace prefix, $t^k$, satisfies path prefix, $p^k$, under the consequence edge labeling, Cons, whenever trace prefix, $t^k$, satisfies path prefix, $p^k$, under the antecedent edge labeling, Ant.

To say that the model M satisfies assertion graph G in n steps (denoted by $M\models^n G$), means that for any edge e beginning at initial vertex vI in G, all states, s, in M satisfy edge e in n steps.

Finally, to say that M strongly satisfies G (denoted by $M\models_{STRONG}G$); means that M satisfies G in n steps for all n greater or equal to 1.

In prior methods for performing STE and GSTE, semantics were used which required strong assumptions with respect to assertion graphs. In STE for example, only finite path lengths traversing the assertion graphs can be generated and used to verify a corresponding system under analysis. This means that for all transitions for which the antecedents are satisfied, along any path of finite length, the corresponding consequences are checked against the behavior of the circuit or system being analyzed. On the other hand, it shall be demonstrated herein that it is desirable for the semantics to consider all transitions along an infinite path to see if the antecedents are satisfied. If any of the antecedents along an infinite path are violated, then it is not necessary to check the consequences for that path.

Strong satisfiability as defined above formally captures a semantics substantially similar to that used in STE and GSTE as proposed in 1997 by Alok Jain. It requires that a consequence hold based solely on past and present antecedents. Strong satisfiability expresses properties that are effects of causes.

For example, model 101 of FIG. 1a can be checked against assertion graph 201 of FIG. 2a. There are two I-paths in assertion graph 201:

p1=[(vI, v1), (v1, v2), (v2, v1), (v1, v2), . . . .],
p2=[(vI, v2), (v2, v1), (v1, v2), (v2, v1), . . . ].

Every prefix of every trace in model 101 trivially satisfies I-path p1 except the trace t3=[s1, s3, s5, s6, s5, . . . ], because the antecedent {s1} is not satisfied by any trace except t3. The consequence labels for path p1 can be written Cons(p1)=[S, {s3, s6}, {s4, s5}, {s3, s6}, . . . ].

For trace t3, every prefix satisfies the consequences on p1 since each state in the trace is included in a corresponding label set for the I-path. Therefore t3 also satisfies p1.

Similarly, every prefix of every trace in model 101 trivially satisfies I-path p2 except the trace t4=[s2, s4, s6, s5, s6, . . . ], because the antecedent {s2} is not satisfied by any trace except t4. The consequence labels for path p2 can be written Cons(p2)=[S, {s4, s5}, {s3, s6}, {s4, s5}, . . . ].

For trace t4, every prefix satisfies the consequences on p2 since each state in the trace is included in a corresponding label set for the I-path. Therefore t4 also satisfies p2. Accordingly model 101 strongly satisfies assertion graph 201.

The method for performing Generalized Symbolic Trajectory Evaluation (GSTE) proposed by Alok Jain, provides implication capabilities for determining future state conditions from a set of initial state conditions. It is also desirable to ask why a set of state conditions occurred. In other words, what possible initial conditions and transitions could cause the system under analysis to end up in a given state? Such a capability is referred to as justification. Strong satisfiability, however, is inadequate for expressing justification properties, which are causes of effects, rather than effects of causes. As an example of a justification property, one might wish to assert the following: if the system enters state s1, and does not start in state s1, then at the time prior to entering state s1, the system must have been in state s0.

Figure 2B:
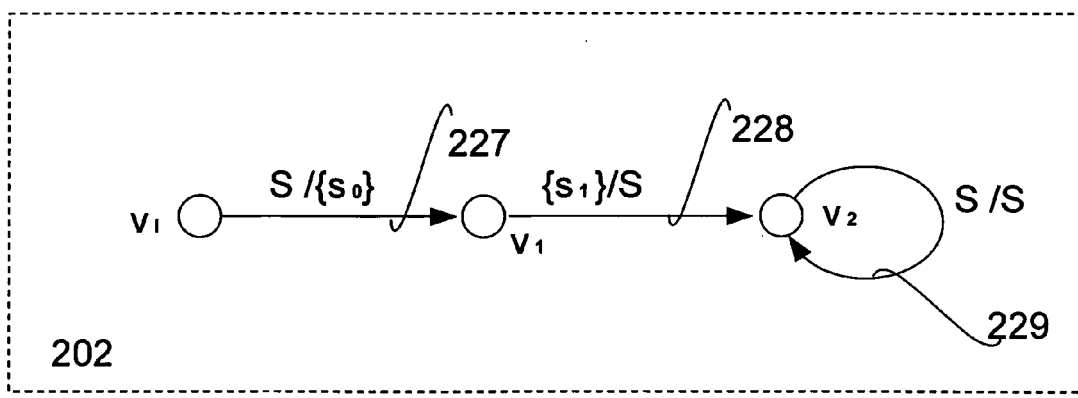
FIG. 2b shows another example of an assertion graph.

For one embodiment, FIG. 2b depicts an assertion graph 202, which attempts to capture the justification property asserted in the above example. Edge 228 from vertex v1 to vertex v2 has an antecedent label {s1} corresponding to the effect portion of the property, and edge 227 from vertex vI to vertex v1 has as a consequence label {s0} corresponding to the cause portion of the property. According to strong satisfiability as defined, the model 101 does not strongly satisfy the assertion graph 202.

For example, the antecedent and consequence labels for the only I-path, pI, of assertion graph 202 can be written Ant(pI)=[S, {s1}, S, S, . . . ].
Cons(pI)=[{s0}, S, S, S, . . . ].

All traces t3 through t8 immediately fail the first consequence label on pI and yet all satisfy the first antecedent label on pI. Therefore traces t3 through t8 do not satisfy pI. Accordingly model 101 does not strongly satisfy assertion graph 202, and what has been demonstrated is that the method proposed by Alok Jain does not provide for justification. In fact, it is substantially impossible to provide for a justification capability within the semantic constraints used by prior STE and GSTE methods. Yet, intuitively, the justification property asserted in the above example is true for model 101. To overcome this discrepancy, a new definition of satisfiability is needed.

For one embodiment, a normal semantics for assertion graphs that provides for justification properties may be formally defined. To say that a trace, t, in a model, M, satisfies a path, p, in an assertion graph, G, under an edge labeling, L (denoted by t|=$_L$p), means that for every i greater than or equal to 1, the ith state in trace, t, is included in the set of states corresponding to the label of the ith edge in path, p.

To say that a state, s, satisfies an edge, e (denoted by s I=e), means that for every trace, t, starting from s and every path, p, starting from e, trace, t, satisfies path, p, under the consequence edge labeling, Cons, whenever trace, t, satisfies path, p, under the antecedent edge labeling, Ant.

To say that the model M satisfies assertion graph G (denoted by M|=G), means that for any edge e beginning at initial vertex vI in G, all states, s, in M satisfy edge e.

Based on the strong semantics and the normal semantics as defined above, it is true to say that if M strongly satisfies G then M satisfies G (expressed symbolically as M|=$_{STRONG}$G ⇒M|=G) for any assertion graph G and any model M. For example, model 101 satisfies assertion graph 201 since model 101 strongly satisfies assertion graph 201.

Returning to examine assertion graph 202 according to the definition of normal satisfiability, the traces t1 and t2 satisfy the consequence labels of I-path pI, and therefore satisfy pI. The traces t3 through t8 all violate the second antecedent label of pI, since none of them enter state s1. Since the antecedent labels are not satisfied, the consequence labels need not be satisfied in order to satisfy the I-path. Therefore t3 through t8 satisfy pI under the normal satisfiability definition. Accordingly, model 101 satisfies assertion graph 202 under the definition of normal satisfiability.

Therefore, for one embodiment, a normal semantics, herein disclosed, provides for assertion graphs, which are capable of expressing justification properties.

It will be appreciated that descriptions of models and assertion graphs, herein disclosed, can be modified in arrangement and detail by those skilled in the art without departing from the principles of the present invention within the scope of the accompanying claims. For example, one popular representation method from automata theory uses automatons, which include automata states, an initial automata state, and a set of state transitions, rather than assertion graphs, which include assertion graph components as described above. A path in an assertion graph is analogous to a run in an automaton, and it can be shown that there is an assertion graph corresponding to the automaton, such that a model satisfies the assertion graph if and only if the model satisfies the automaton.

The assertion graph can be seen as a monitor of the circuit, which can change over time. The circuit is simulated and results of the simulation are verified against consequences in the assertion graph. The antecedent sequence on a path selects which traces to verify against the consequences.

For one embodiment, a simulation relation sequence can be defined for model checking according to the strong satisfiability criteria defined above. For an assertion graph G and a model M=(Pre, Post), define a simulation relation sequence, Sim$_n$: E→P(S), mapping edges between vertices in G into state subsets in M as follows:

Sim$_1$(e)=Ant(e) if Head(e)=vI, otherwise
Sim$_1$(e)={ };
Sim$_n$(e)=Union (Sim$_{n-1}$(e), (Union$^{for\ all\ e'\ such\ that\ Tail(e')}_{=Head(e)}$ (Intersect (Ant(e), Post(Sim$_{n-1}$(e'))) ))), for all n>1.

In the simulation relation defined above, the nth simulation relation in the sequence is the result of inspecting every state sequence along every I-path of lengths up to n. For any n>1, a state s is in the nth simulation relation of an edge e if it is either in the n−1th simulation relation of e, or one of the states in its pre-image set is in the n-Ith simulation relation of an incoming edge e', and state s is in the antecedent set of e. It will be appreciated that the Union operation and the Intersect operation may also be interpreted as the Join operation and the Meet operation respectively.

Figure 3A:
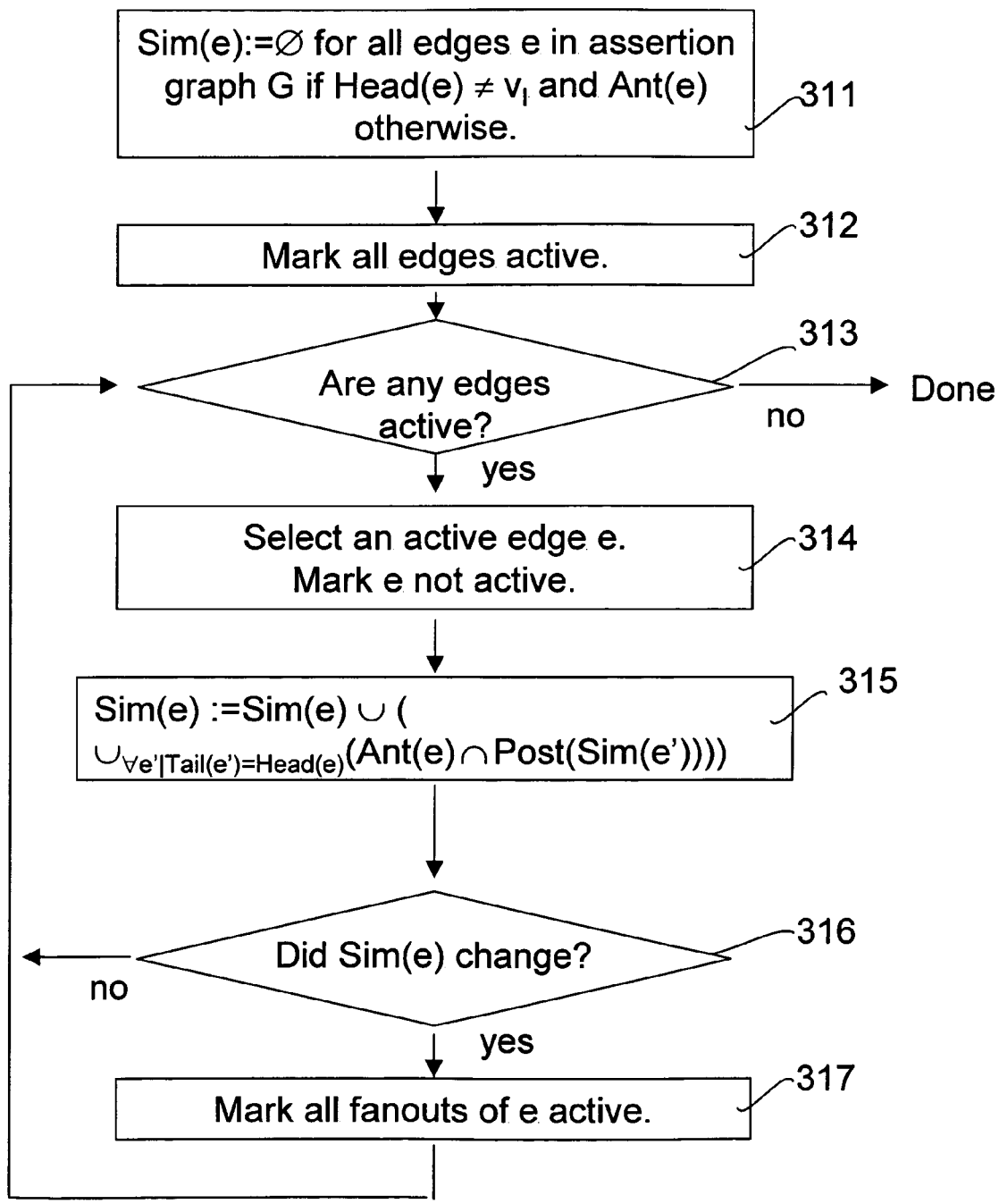
FIG. 3a illustrates for one embodiment, a method for computing a simulation relation sequence.

For one embodiment, FIG. 3a illustrates a method for computing the simulation relation for a model and an assertion graph. Box 311 represents initially assigning an empty set to the simulation relation for all edges e in the assertion graph that do not begin at initial vertex vI, and initially assigning Ant(e) to the simulation relation for all edges e that do begin at initial vertex vI. Box 312 represents marking all edges in the assertion graph active. Box 313 represents testing the assertion graph to identify any active edges. If no active edges are identified, then the method is complete. Otherwise, an active edge, e, is selected and marked not active as represented by box 314. Box 315 represents recomputing the simulation relation for edge, e, by adding to the simulation relation for edge e, any states which are in both the antecedent set for edge e and the post-image set for the simulation relation of any incoming edge, e', to e. Box 316 represents testing the simulation relation for edge e to determine if it was changed by the recomputation. If it has changed, all outgoing edges from e are marked as active, as represented by Box 317. In any case, the method flow returns to the test for active edges represented by Box 313.

Figure 4:
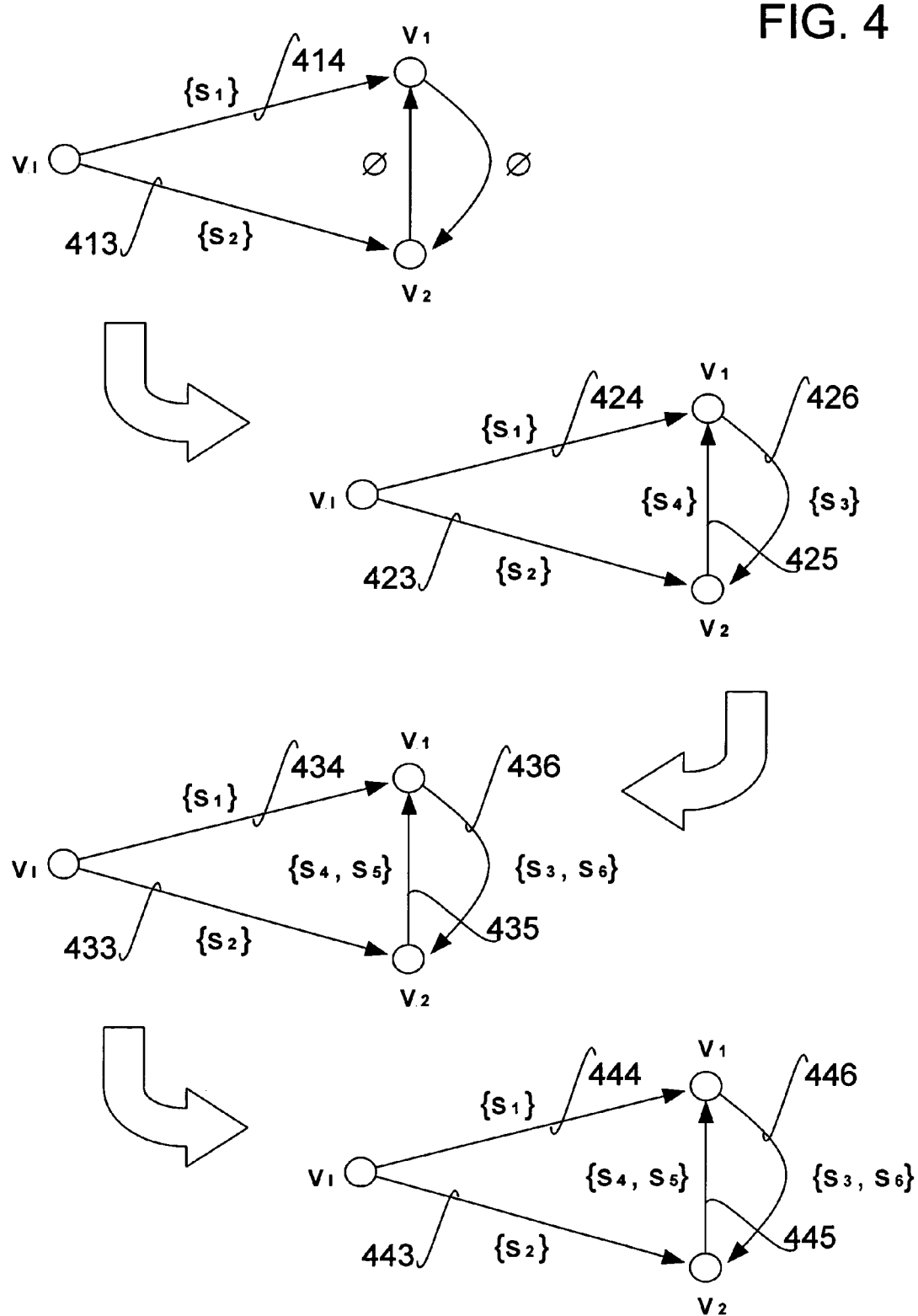
FIG. 4 shows changes in a simulation relation of an assertion graph 201 and model 101 resulting over time as the method of FIG. 3a is iterated.

For example, FIG. 4 shows changes over time in the assertion graph 201 resulting from simulation of the model 101. Initially only edge 413 and edge 414 have state s2 and state s1, respectively, associated with them. In the first subsequent iteration, state s3 is added to edge 426 since s3 is in the post-image of {s1} in model 101 and in the antecedent set of edge 426 in assertion graph 201. Similarly s4 is added to edge 425. In the next iteration, s6 is added to edge 436 because it is in the post-image of {s4} and in the antecedent set of edge 436. State s5 is added to edge 435 because it is in the post-image of {s3} and in the antecedent set of edge 435. In the final iteration, no new states are added to any edge. Therefore a fixpoint solution is reached.

Comparing the final simulation relation for each edge, with the consequence set for that edge, indicates whether the model 101 strongly satisfies the assertion graph 201. Since {s1} of edge 444 is a subset of the consequence set S, edge 214 is satisfied. Since {s2} of edge 443 is a subset of the consequence set S, edge 213 is satisfied. Since {s4, s5} of edge 445 is a subset of the consequence set {s4, s5}, edge 215 is satisfied. Finally, since {s3, s6} of edge 446 is a subset of the consequence set {s3, s6}, edge 216 is satisfied. Therefore the final simulation relation indicates that model 101 strongly satisfies assertion graph 201.

In order to indicate normal satisfiability, a method is needed to propagate future antecedents backwards. For one embodiment, a method can be defined to strengthen the antecedent set of an edge e by intersecting it with the pre-image sets of antecedents on future edges. Since the strengthening method can have rippling effects on the incoming edges to e, the method should be continued until no remaining antecedents can be propagated backwards.

For one embodiment, an antecedent strengthening sequence can be defined for model checking according to the normal satisfiability criteria defined above. For an assertion graph G and a model M=(Pre, Post), define an antecedent strengthening sequence, $Ant_n$: E→P(S), mapping edges between vertices in G into state subsets in M as follows:

$Ant_1(e)=Ant(e)$, and $Ant_n(e)$=Intersect $(Ant_{n-1}(e'), (Union_{for\ all\ e'\ such\ that\ Head(e')=Tail(e)}\ Pre(Ant_{n-1}(e')) ))$, for all n>1.

In the antecedent strengthening sequence defined above, a state s is in the nth antecedent set of an edge e if it is a state in the n–1th antecedent set of e, and one of the states in a pre-image set of the n–1th antecedent set of an outgoing edge e'. Again, it will be appreciated that the Union operation and the Intersect operation may also be interpreted as the Join operation and the Meet operation respectively.

Figure 3B:
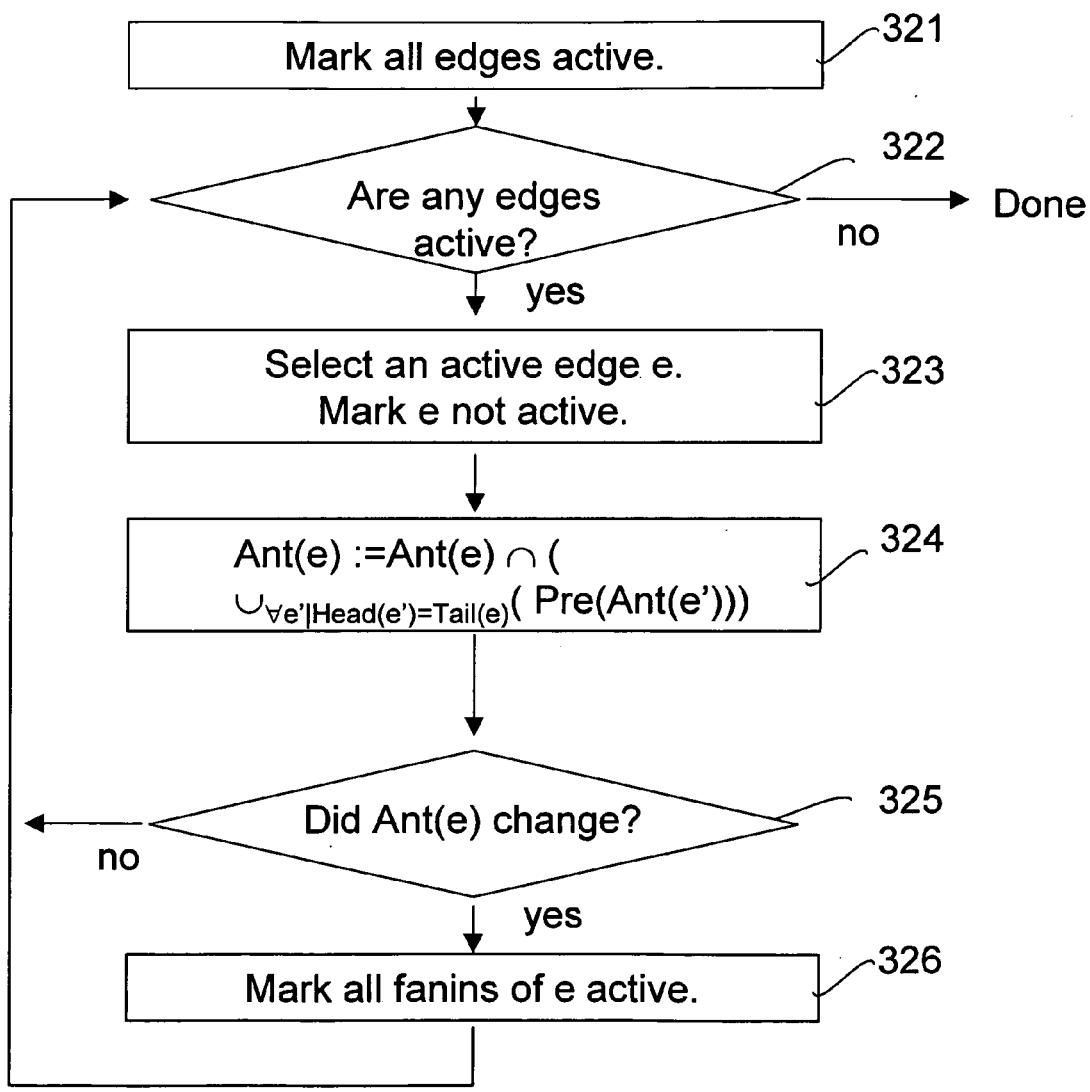
FIG. 3b illustrates for one embodiment, a method for computing an antecedent strengthening sequence.

For one embodiment, FIG. 3b illustrates a method for computing the strengthened antecedents for an assertion graph. Box 321 represents marking all edges in the assertion graph active. Box 322 represents testing the assertion graph to identify any active edges. If no active edges are identified, then the method is complete. Otherwise, an active edge, e, is selected and marked not active as represented by box 323. Box 324 represents recomputing the antecedent label for edge, e, by keeping in the antecedent label for edge e, any states that are already contained by the antecedent label for edge e and also contained by some pre-image set for the antecedent label of any edge, e', outgoing from e. Box 325 represents testing the antecedent label for edge e to determine if it was changed by the recomputation. If it has changed, all incoming edges to e are marked as active, as represented by Box 326. In any case, the method flow returns to the test for active edges represented by Box 322.

Figure 5A:
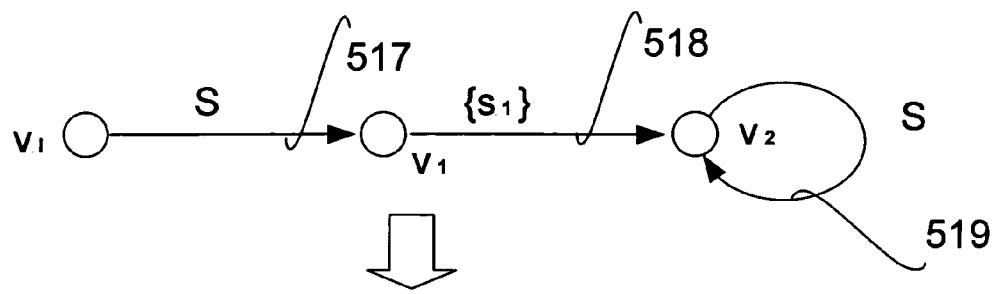
FIG. 5a shows changes in an antecedent labeling of an assertion graph 202 and model 101 resulting over time from antecedent strengthening.
Figure 5A:
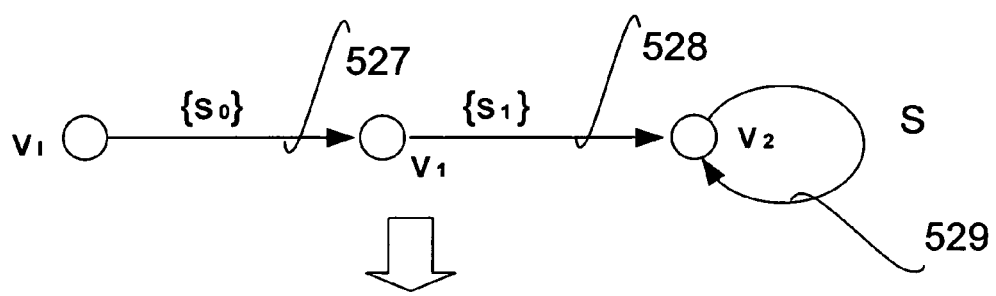
Figure 5A:
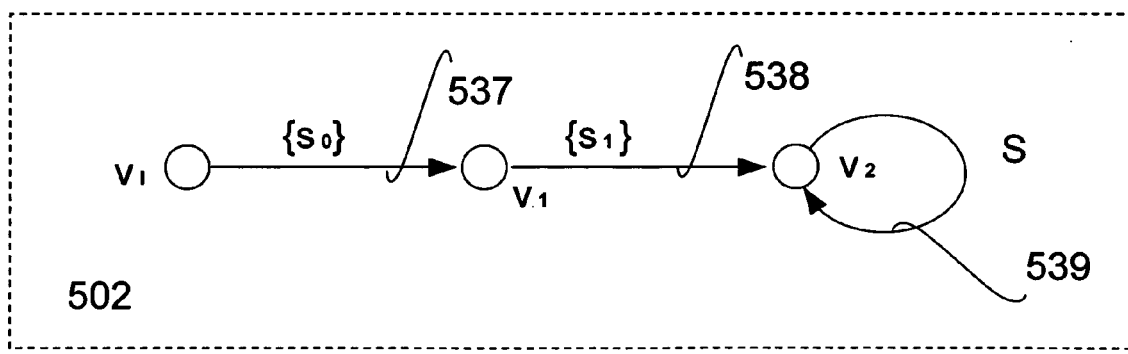

For example, FIG. 5a shows iterations of antecedent strengthening of graph 202 on model 101. The antecedent sets are shown for edges 517 as S and 518 as {s1}. Therefore the antecedent set for edge 527 is computed as the antecedent set for edge 517, S, intersected with the pre-image set of the antecedent set of outgoing edge 518, denoted Pre({s1}), which is {s0}. Thus the antecedent set of edge 527 is strengthened to {s0} and the antecedent sets for edges 528 and 529 are unchanged. In the final iteration, no antecedent sets are changed and so a fixpoint solution 502 is reached and the iterations are terminated.

Figure 5B:
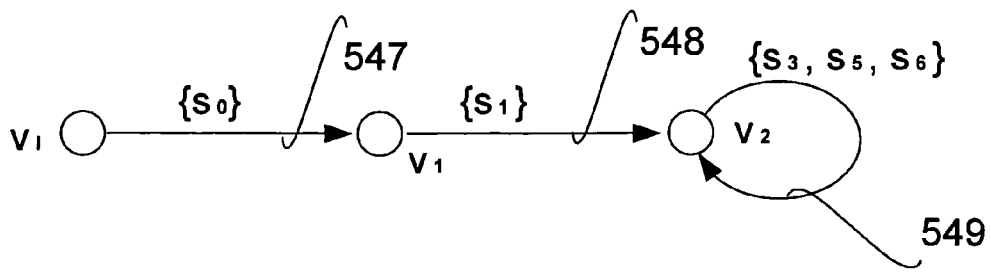

FIG. 5b shows the final simulation relation resulting from iterations of the method of FIG. 3a performed on the antecedent strengthened assertion graph 502 and using model 101. Comparing the final simulation relation labels for each edge, with the consequence set for that edge (as shown in assertion graph 202) indicates whether the model 101 strongly satisfies the strengthened assertion graph 502. Since the simulation relation set {s0} of edge 547 is a subset of the consequence set {s0} of edge 227 and accordingly of edge 537, edge 537 is satisfied. Since the simulation relation set {s1} of edge 548 is a subset of the consequence set S of edge 228 and accordingly of edge 538, edge 538 is satisfied. Since the simulation relation set {s3, s5, s6} of edge 549 is a subset of the consequence set S of edge 229 and accordingly of edge 539, edge 539 is satisfied. Therefore model 101 strongly satisfies the antecedent strengthened assertion graph 502, but more importantly model 101 satisfies assertion graph 202 according to normal satisfiability as previously defined.

The fact that transition paths of infinite length are being considered does not mean that the list of possible antecedents will be infinite. Since the assertion graph describes a finite state machine, the number of permutations of those finite states is also finite. Therefore a fixpoint does exist and the monotonic methods of FIG. 3a and FIG. 3b are guaranteed to converge on their respective fixpoints and terminate, given a large enough set of finite resources.

Figure 6A:
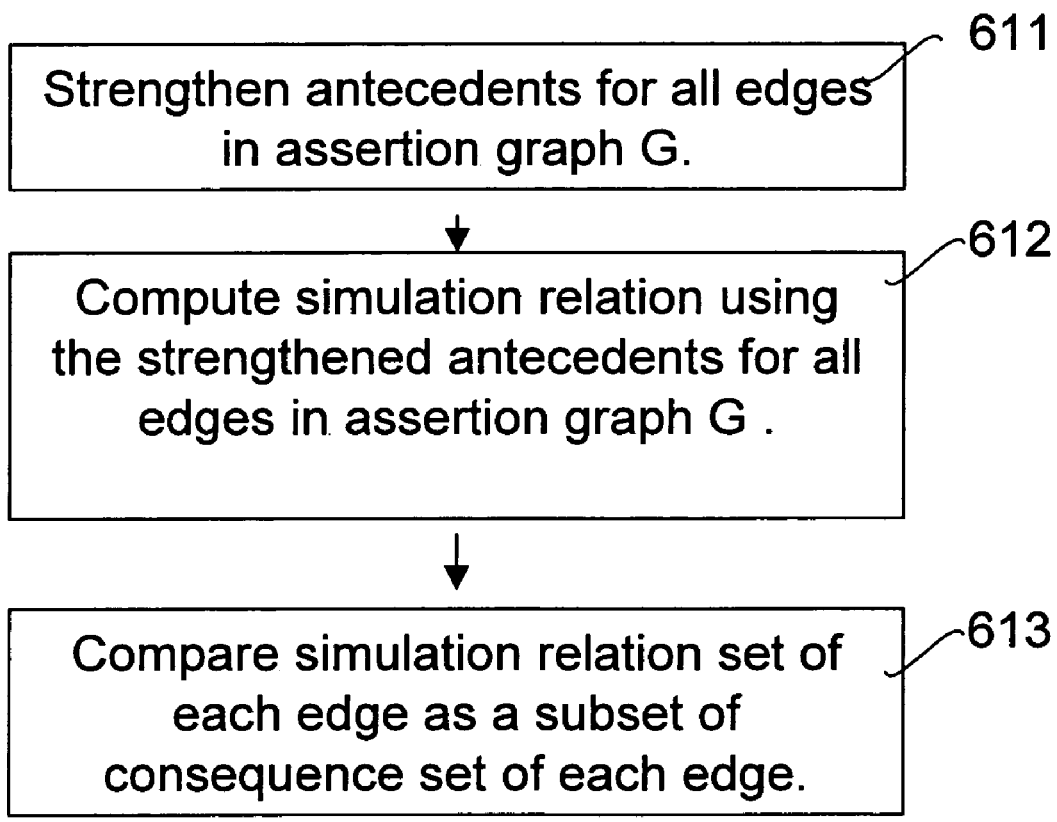
FIG. 6a illustrates for one embodiment, a method for computing normal satisfiability.

For one embodiment, FIG. 6a shows a method for computing the normal satisfiability of an assertion graph by a model. In block 611, the antecedent sets are strengthened for each edge in the assertion graph. In block 612, a fixpoint simulation relation is computed using the antecedent strengthened assertion graph. Finally in block 613, the simulation relation sets are compared to the consequence sets to see if, for each edge, the simulation relation set is a subset of the consequence set, which is the necessary condition for satisfiability.

Figure 6B:
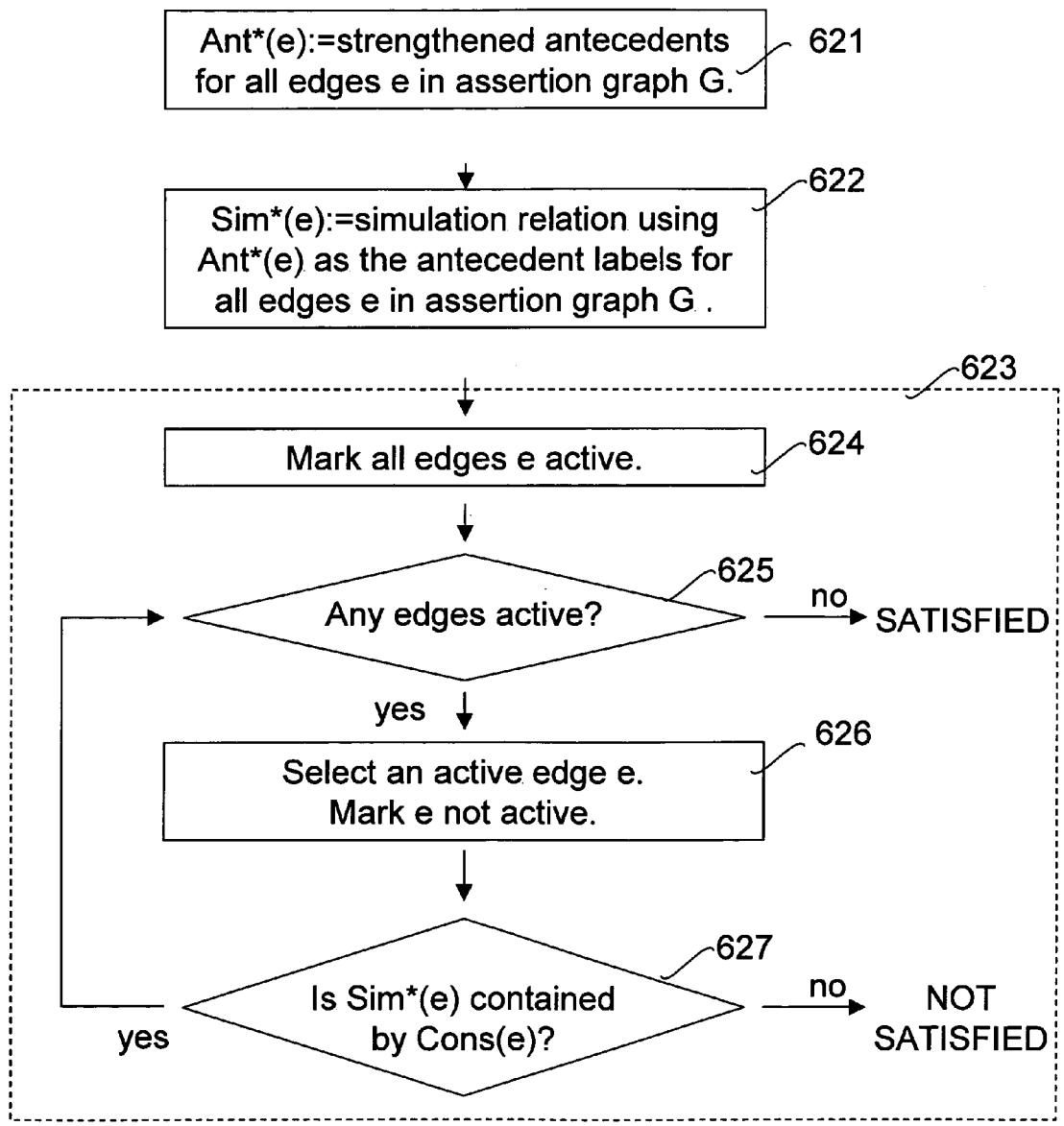
FIG. 6b illustrates for one embodiment, a method for computing normal satisfiability using the simulation relation of an antecedent strengthened graph.

For one embodiment, FIG. 6b illustrates, in finer detail, a method of computing normal satisfiability. In block 621, the strengthened antecedent set fixpoint for each edge e (denoted Ant*(e)) in assertion graph G is computed. In block 622, a fixpoint simulation relation set for each edge e (denoted Sim*(e)) is computed using the strengthened antecedents computed for each edge in block 621. In block 623, the comparison is performed. First, the edges are marked active in block 624. Then a test is performed in block 625 to determine if any active edges remain to be compared. If not, the method is complete and the assertion graph is satisfied by the model. Otherwise, an active edge, e, is selected in block 626 and set to not active. In block 627, the simulation relation set, Sim*(e), is compared to see if it is a subset of the consequence set, Cons(e). If not, the assertion graph is not satisfied by the model. Otherwise the method flow returns to the test at block 625 to determine if more edges remain to be compared.

For real-world finite-state systems, the number of states to be verified can be vary large and can contribute to a problem known as state explosion, which can, in turn, cause a failure of an automated verification process. One advantage of STE and GSTE, which perform computations in a lattice domain, is that they are less susceptible to state explosion. One lattice domain of interest is the set of all subsets of S, P(S) along with a subset containment relation, $\subseteq$. The subset containment relation defines a partial order between elements of P(S), with the empty set as a lower bound and S as an upper bound. The set P(S) together with the subset containment relation, $\subseteq$, are called a partially ordered system.

One important strength of trajectory evaluation based on lattice theory comes from abstraction. An abstraction maps the original problem space into a smaller problem space. For instance, a state trace is simply a record of the sequence of state transitions a system undergoes—during a simulation for example. Semantics for a language to describe all possible state transition sequences as disclosed can be easily understood by practitioners. A trajectory can be viewed as an abstraction of multiple state traces, which combines multiple possible state transition paths into equivalence class abstractions. Therefore an elegant semantics for a language to describe all possible trajectories can be defined by combining the semantics for state transition sequences with an abstraction layer to describe trajectories.

For one embodiment an abstraction of the lattice domain (P(S), $\subseteq$) onto a lattice domain (P, $\subseteq_A$) can be defined by an abstraction function A mapping P(S) onto P such that A maps the upper bound S of P(S) to the upper bound U of P; A maps a lattice point S0 to the lower bound Z of P if and only if S0 is the lower bound of P(S), the empty set; A is surjective (onto); and A is distributive (e.g. A(Union({s1, s2}, {s0}))=Union(A({s1, s2}), A({s0}))=Union(S12, S0)).

Figure 7:
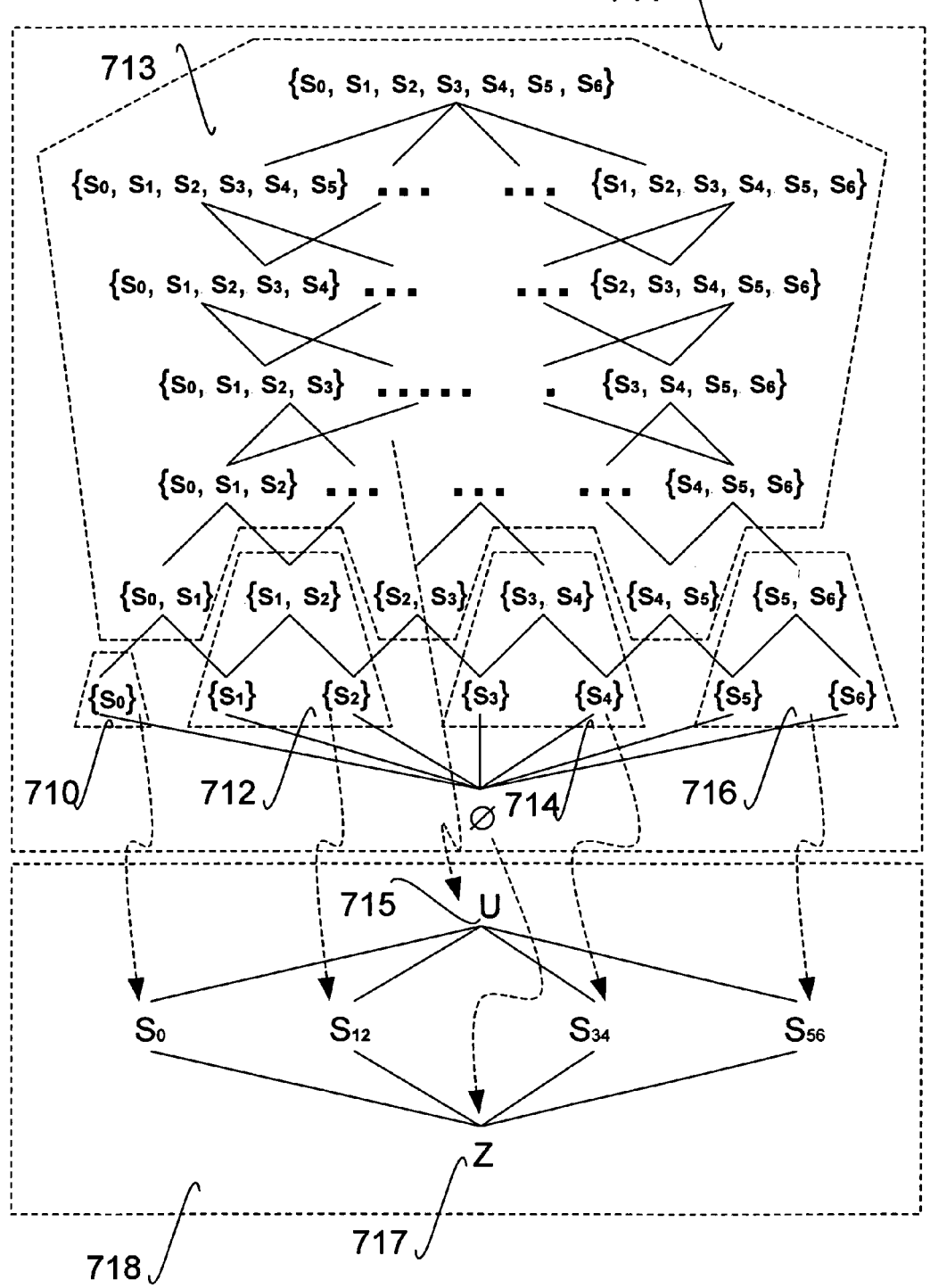
FIG. 7 shows a lattice domain and a lattice domain abstraction.

FIG. 7 illustrates one embodiment of an abstraction function A. The lattice domain 718 is an abstraction of the lattice domain 711 through an abstraction function A, which maps cluster 713 including the upper bound {s0, s1, s2, s3, s4, s5, s6} of lattice domain 711 to the upper bound U of lattice domain 718; the lower bound of lattice domain 711 to the lower bound 717 of lattice domain 718; cluster 710 including lattice point {s0} to lattice point S0; cluster 712 including lattice points {s1}, {s2} and {s1, s2} to lattice point S12, cluster 714 including lattice points {s3}, {s4} and {s3, s4} to lattice point S34; and cluster 716 including lattice points {s5}, {s6} and {s5, s6} to lattice point S56.

A concretization of the lattice domain (P, $\subseteq_A$) back to the lattice domain (P(S), $\subseteq$) can be defined by a concretization function A$^-$ mapping P into P(S) such that A$^-$ maps a lattice point S1 of P to the union of all subsets {si, . . . sj} in P(S) for which A({si, . . . sj})=Si. Therefore the concretization for the abstraction illustrated in FIG. 7, is given by A$^-$(U)=S, A$^-$(Z)={ }, A$^-$(S0)={s0}, A$^-$(S12)={s0,s1}, A$^-$(S34)={s3, s4}, A$^-$(S56)={s5,s6}.

Two important points with respect to abstractions are that the partial ordering among points in the original lattice domain are preserved in the abstract lattice domain, and that abstraction may cause potential information loss while concretization will not. For example in FIG. 7, A$^-$(A({s1}))= {s1, s2} $\supseteq$ {s1}, but A(A$^-$(S12))=A({s1,s2})=S12.

For one embodiment, a definition of a model M can be formally defined on a lattice domain (P, $\subseteq$) as a pair of monotonic transformers, Pre and Post, such that Si $\subseteq$ Pre(Post(Si)) and that Post(Si)=Z if and only if Si=Z. The second condition ensures that the lower bound, which usually represents the empty set, is properly transformed. An abstraction of M on a lattice domain (P$_A$, $\subseteq_A$) can be defined as M$_A$=(Pre$_A$, PoSt$_A$) such that
  A(Pre(Si)) $\subseteq_A$ Pre$_A$(A(Si))  and  A(Post(Si)) $\subseteq_A$ Post$_A$(A(Si)), for all Si in P.

For one embodiment, a finite sequence of lattice points of length, n, is called a finite trajectory, T, in the model M if it does not include the lower bound Z and it is true of every pair of lattice points, Si and Si+1, occurring in the ith and i+1th positions respectively in the sequence (i being contained within the closed interval [1,n–1]) that Si $\subseteq$ Pre(Si+1) and Si+1 $\subseteq$ Post(Si). An infinite trajectory is a sequence of lattice points, which satisfies the above conditions for all i greater or equal to 1. Intuitively a trajectory represents a collection of traces in the model.

An assertion graph G on a lattice domain (P, $\subseteq$) is defined as before except that the antecedent labeling and the consequence labeling map edges more generally to lattice points Si instead of state subsets. The abstraction of an assertion graph is straightforward. The abstracted assertion graph G$_A$ is an assertion graph on a lattice domain (P$_A$, $\subseteq_A$) having the same vertices and edges as G and for the abstracted antecedent labeling Ant$_A$ and the abstracted consequence labeling Cons$_A$, Ant$_A$(e)=A(Ant(e)) and Cons$_A$(e)=A(Cons(e)) for all edges e in the assertion graphs G$_A$ and G.

If A$^-$(A(Cons(e)))=Cons(e) for all edges e in G, then G is said to be truly abstractable and the unique abstraction GA is said to be a true abstraction If assertion graph G is truly abstractable, then the methods previously disclosed are sufficient for antecedent strengthening, determining strong satisfiability and determining normal satisfiability using model and assertion graph abstractions. For example if methods herein previously disclosed determine that an abstracted model M$_A$ strongly satisfies a true abstraction G$_A$, then the original model M strongly satisfies the original assertion graph G, according to the strong satisfiability criteria. Similarly, if methods herein previously disclosed determine that an abstracted model M$_A$ satisfies a true abstraction G$_A$, then the original model M satisfies the original assertion graph G, according to the normal satisfiability criteria.

In general though, an arbitrary assertion graph G is not guaranteed to be truly abstractable. In such cases, using the previously disclosed methods on an abstracted model and an abstracted assertion graph are not guaranteed to indicate satisfiability of the original assertion graph G by the original model M.

For one embodiment, alternative methods provide true implications of strong satisfiability and of normal satisfiability from computations performed on abstracted models and abstracted assertion graphs, which are not necessarily true abstractions. One key observation is that A$^-$(Sim$_A$*(e)) $\supseteq$Sim*(e). A second key observation is that A$^-$(Ant$_A$*(e)) $\supseteq$Ant*(e). In other words the concretization function generates a conservative approximation of a fixpoint simulation relation from a fixpoint simulation relation abstraction and a conservative approximation of a fixpoint strengthened antecedent set from a fixpoint strengthened antecedent set abstraction.

Therefore a method may be constructed which would permit the possibility of false verification failures but would not permit a false indication of assertion graph satisfiability. A result from such a method may be refered to as implicit satisfiability.

Figure 8A:
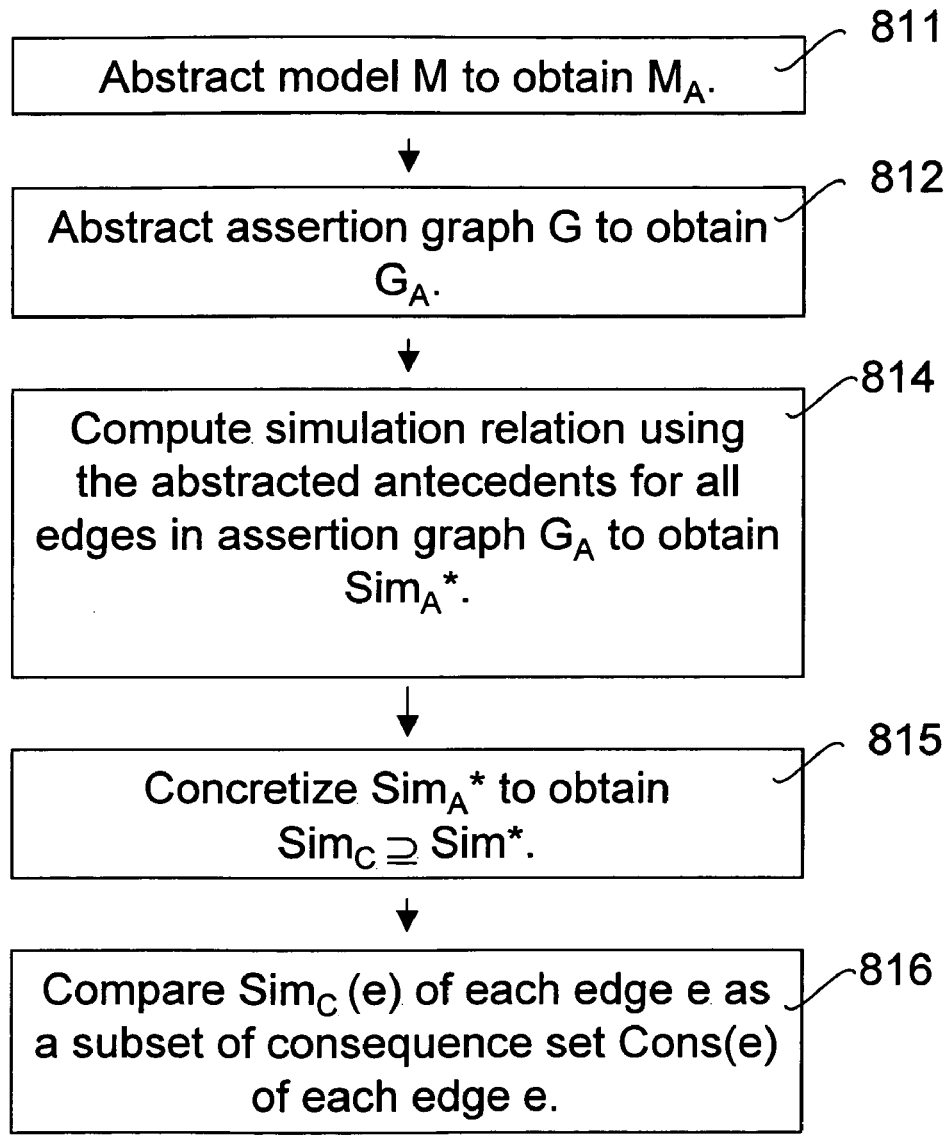
FIG. 8a illustrates for one embodiment, a method for implicating strong satisfiability using an abstracted simulation relation.

For one embodiment, FIG. 8a illustrates a method for implicit strong satisfiability using an abstracted simulation relation. In block 811, an abstraction $M_A$ of model M is computed. In block 812 an abstraction $G_A$ of assertion graph G is computed, which is not guaranteed to be a true abstraction of assertion graph G. In block 814, a simulation relation sequence is computed using the abstracted antecedents for all edges e in $G_A$. In block 815, the concretization function is used to conservatively approximate the original fixpoint simulation relation Sim*. In block 816, the conservative approximation (denoted $Sim_C$) of Sim* is compared to the original consequence set for each edge e in G. If for every edge e in G, $Sim_C(e) \subseteq Cons(e)$ then the original model M strongly satisfies the original assertion graph G.

Figure 8B:
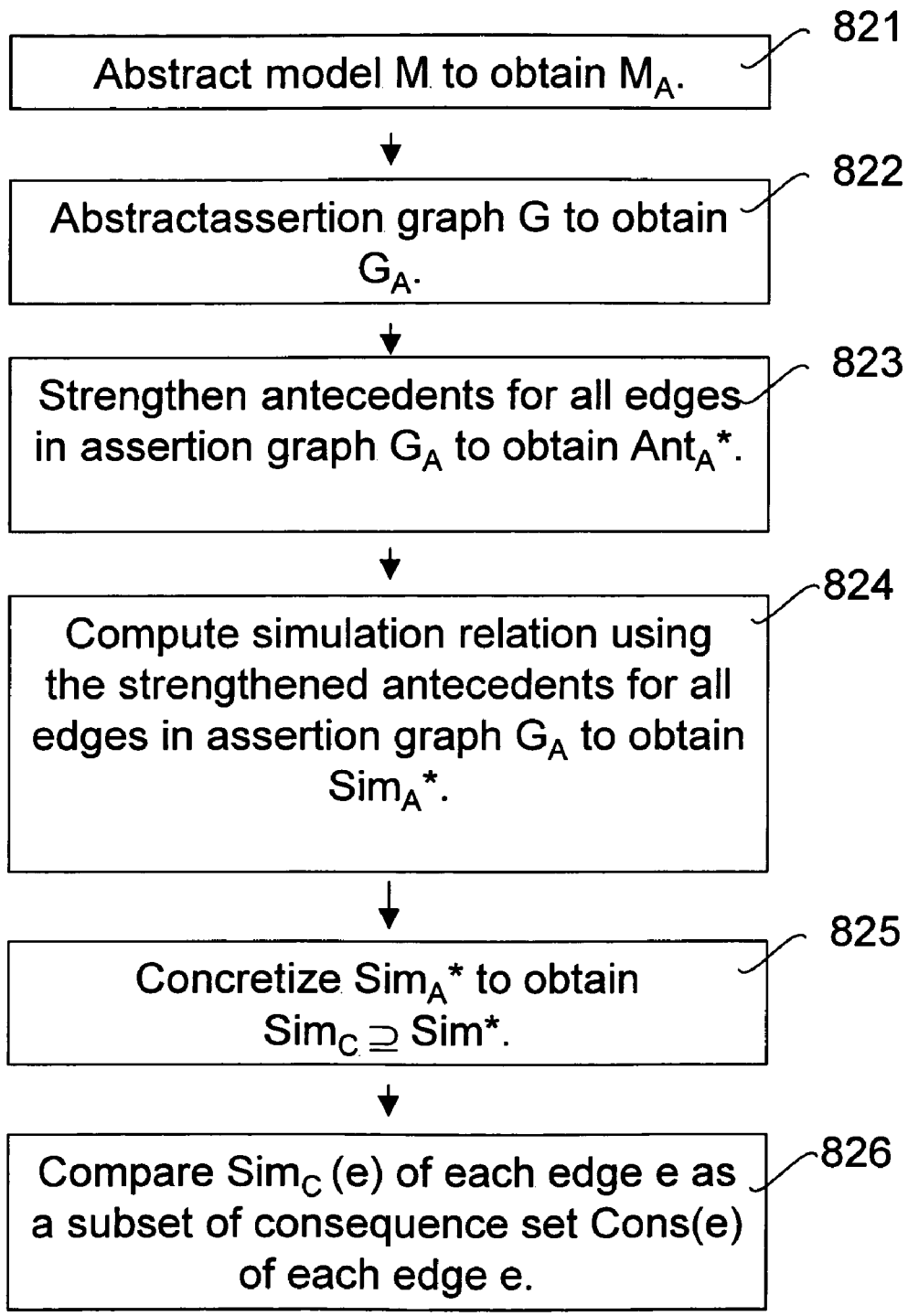
FIG. 8b illustrates for one embodiment, a method for implicating normal satisfiability using an abstracted simulation relation of an abstracted antecedent strengthened assertion graph.

For one embodiment, FIG. 8b illustrates a method for implicit normal satisfiability using an abstracted simulation relation. In block 821, an abstraction $M_A$ of model M is computed. In block 822 an abstraction $G_A$ of assertion graph G is computed, which is not guaranteed to be a true abstraction of assertion graph G. In block 823, the abstracted antecedents of $G_A$ are strengthened until a fixpoint is reached. In block 824, a simulation relation sequence is computed using the strengthened antecedents for all edges e in $G_A$. In block 825, the concretization function is used to conservatively approximate the original fixpoint simulation relation Sim*. In block 826, the conservative approximation (denoted $Sim_C$) of Sim* is compared to the original consequence set for each edge e in G. If for every edge e in G, $Sim_C(e) \subseteq Cons(e)$ then the original model M satisfies the original assertion graph G according to the normal satisfiability criteria.

Figure 8C:
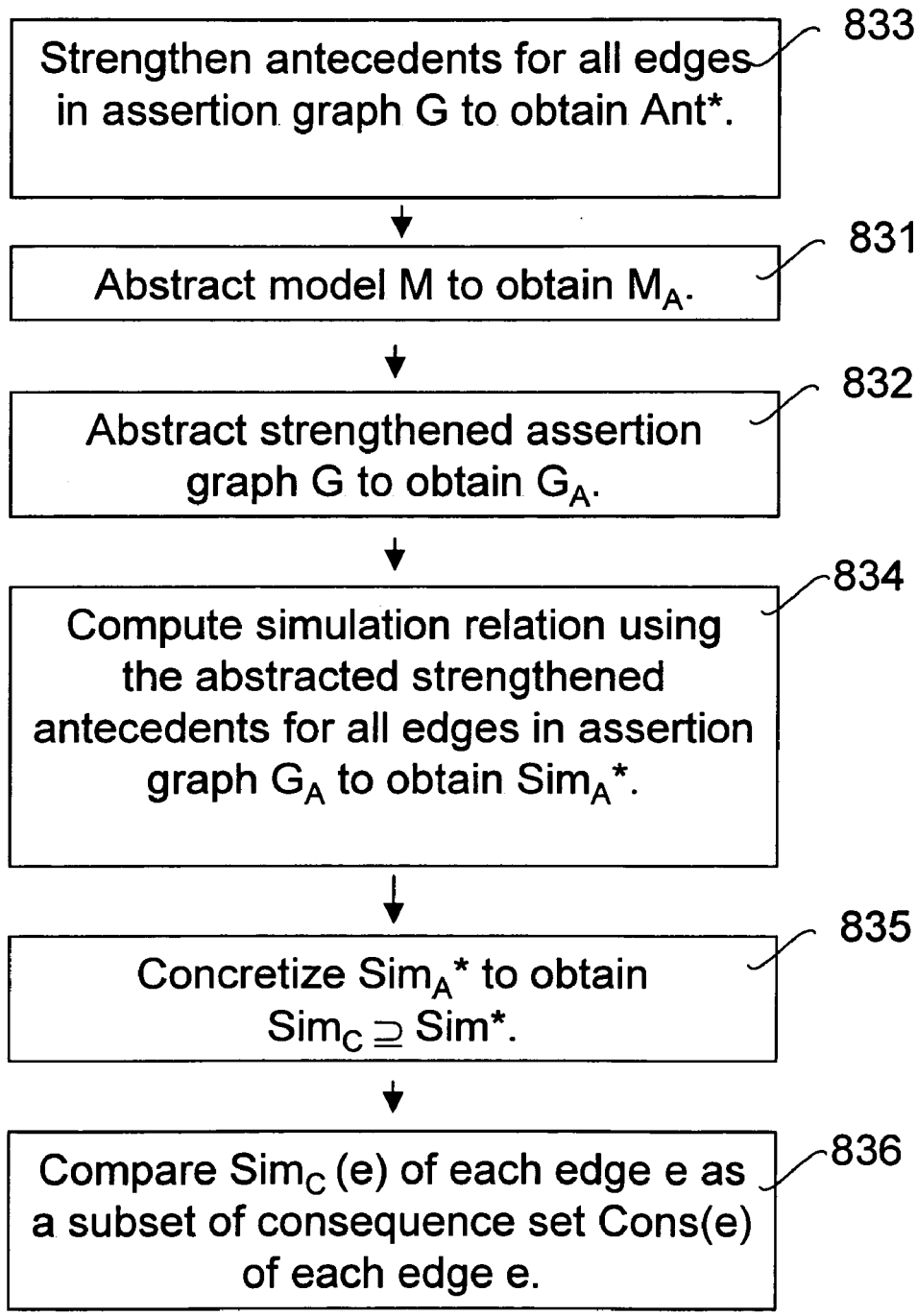
FIG. 8c illustrates for one alternative embodiment, a modified method for implicating normal satisfiability using an abstracted simulation relation.

It will be appreciated that the methods herein disclosed may be modified in arrangement and detail by those skilled in the art without departing from the principles of these methods within the scope of the accompanying claims. For example, FIG. 8c illustrates for one alternative embodiment of a modified method for implicit normal satisfiability using an abstracted simulation relation. In block 833, the antecedents of an assertion graph G are strengthened until a fixpoint is reached. In block 831, an abstraction $M_A$ of model M is computed. In block 832 an abstraction $G_A$ of the antecedent strengthened assertion graph G is computed. In block 834, a simulation relation sequence is computed using the abstracted strengthened antecedents for all edges e in $G_A$. In block 835, the concretization function is used to conservatively approximate the original fixpoint simulation relation Sim*. In block 836, the conservative approximation (denoted $Sim_C$) of Sim* is compared to the original consequence set for each edge e in G. If for every edge e in G, $Sim_C(e) \subseteq Cons(e)$ then the original model M satisfies the original assertion graph G according to the normal satisfiability criteria.

It will be appreciated that for many circuits or other finite state systems, there exists a family of properties related to a particular functionality. For example, an adder circuit may have scalar input values c1 and c2 and it may be desirable to verify that the adder output would be c1+c2 if a particular adder control sequence is satisfied. It will also be appreciated that the number of scalar input combinations is an exponential function of the number of input bits to the adder and therefore it would be tedious if not impractical to express each scalar property as an assertion graph and to verify them individually.

Previously, merging numerous scalar cases into one assertion graph has been problematic. A merged graph may have a size that is also an exponential function of the number of inputs if the merged graph cannot exploit shared structures. Alternatively a merged graph having a reasonable size may fail to verify a property if critical information is lost in lattice operations.

For one embodiment, a method for representing and verifying assertion graphs symbolically provides an effective alternative for verifying families of properties. Once an assertion graph can be adequately represented symbolically, a symbolic indexing function provides a way of identifying assignments to Boolean variables with particular scalar cases. Formally defining a class of lattice domains based on symbolic indexing functions, provides an efficient symbolic manipulation technique using BDDs. Therefore previously disclosed methods for antecedent strengthening, abstraction, computing simulation relations, verifying satisfiability and implicit satisfiability may be extended to assertion graphs that are symbolically represented.

For one embodiment, an m-ary symbolic extension of a lattice domain (P, $\subseteq$) can be set forth as a set of symbolic indexing functions $\{B^m \rightarrow P\}$ where $B^m$ is the m-ary Boolean product. A symbolic indexing function I in $\{B^m \rightarrow P\}$ encodes a group of points on the lattice such that each point is indexed by a particular m-ary Boolean value as follows:

I ($\underline{x}$)=$OR_{for\ \underline{b}\ in\ B^m}((\underline{x}=\underline{b})$ AND (I($\underline{b}$)), where $\underline{x}$ denotes (x1, x2, . . . , xm), $\underline{b}$ denotes (b1, b2, . . . , bm) and ($\underline{x}=\underline{b}$) denotes ((x1=b1) AND (x2=b2) AND . . . AND (xm=bm)).

A symbolic indexing function I1 is less than or equal to a symbolic indexing function I2, denoted I1($\underline{x}$) $\subseteq_S$ I2($\underline{x}$), if and only if for all $\underline{b}$ n $B^m$, I1($\underline{b}$) $\subseteq$ I2($\underline{b}$).

For one embodiment, a symbolic extension of a model M=(Pre, Post) on a lattice domain (P, $\subseteq$) can be set forth as a pair of transformers, $Pre_S$ and $Post_S$, on the lattice domain ($\{B^m \rightarrow P\}$, $\subseteq_S$) such that $Pre_S(I(\underline{x}))=OR_{for\ \underline{b}\ in\ B^m}((\underline{x}=\underline{b})$ AND Pre(I($\underline{b}$))), and
$Post_S(I(\underline{x}))=OR_{for\ \underline{b}\ in\ B^m}((\underline{x}=\underline{b})$ AND Post(I($\underline{b}$))), for every I($\underline{x}$) in the set of symbolic indexing functions $\{B^m \rightarrow P\}$. Such a symbolic extension $M_S=(Pre_S, Post_S)$ is called a model on the finite symbolic lattice domain ($\{B^m \rightarrow P\}$, $\subseteq_S$).

Figure 9:
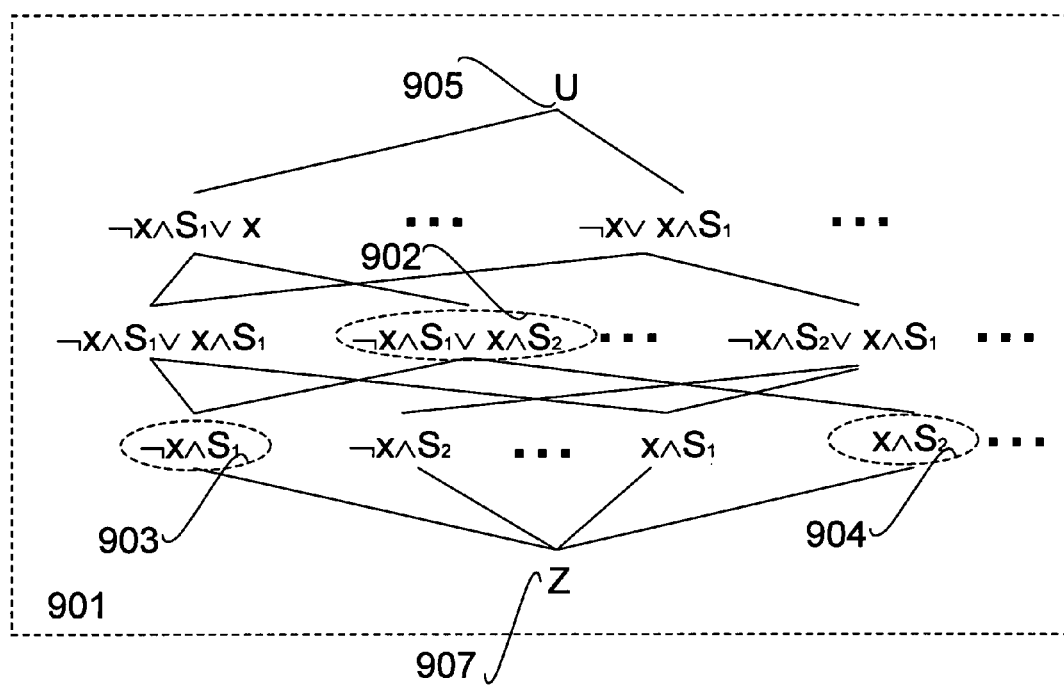
FIG. 9 depicts part of a unary symbolic lattice domain ($\{B^1 \rightarrow P\}, \subseteq_s$)

As an example of a symbolic lattice domain, FIG. 9 depicts part of a unary symbolic lattice domain. The unary symbolic indexing funtion I($\underline{x}$)=¬x AND S1 OR x AND S2 encodes two points S1 and S2 on the lattice domain 901. The symbolic indexing function 902 indexes S1 when x=0 corresponding to lattice point 903 and indexes S2 when x=1 corresponding to lattice point 904.

Figure 10:
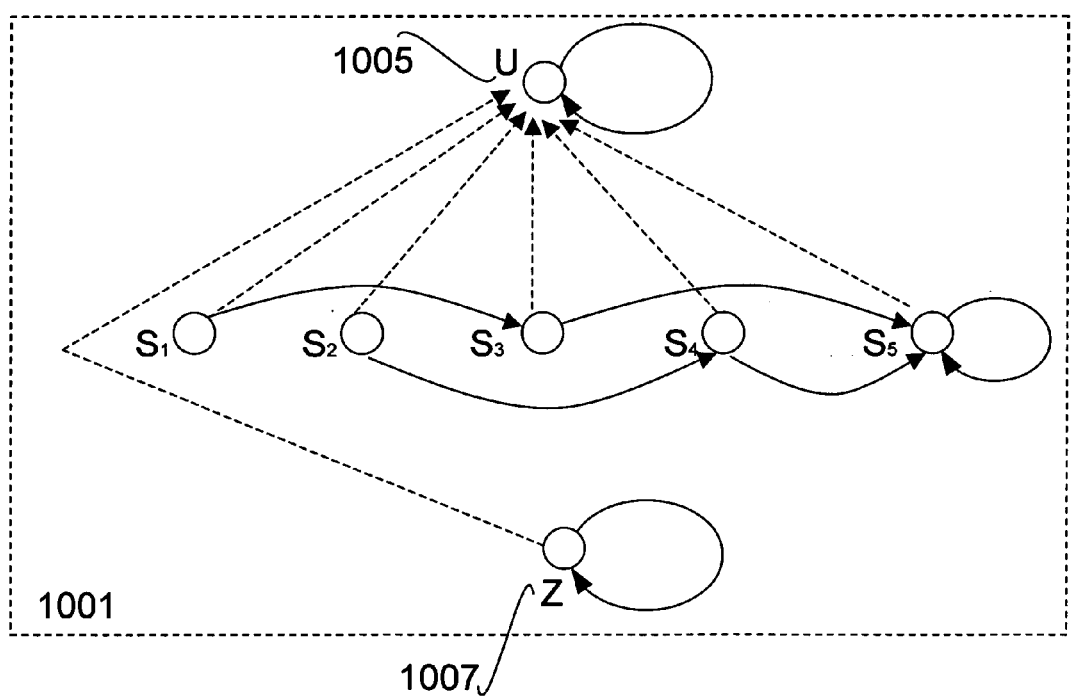
FIG. 10 shows a model on a lattice domain (P, $\subseteq$).

FIG. 10 shows a model 1001 on a lattice domain (P, $\subseteq$). The model 1001 has state subsets corresponding to lattice points S1, S2, S3, S4, and S5. In addition lattice lower bound 1007 corresponds to the empty set of states, and lattice upper bound 1005 corresponds to all state subsets containing one or more of S1, S2, S3, S4, and S5. The model 1001 has non-trivial transitions (S1, S3), (S2, S4), (S3, S5), (S4, S5) and (S5, S5).

Figure 11A:
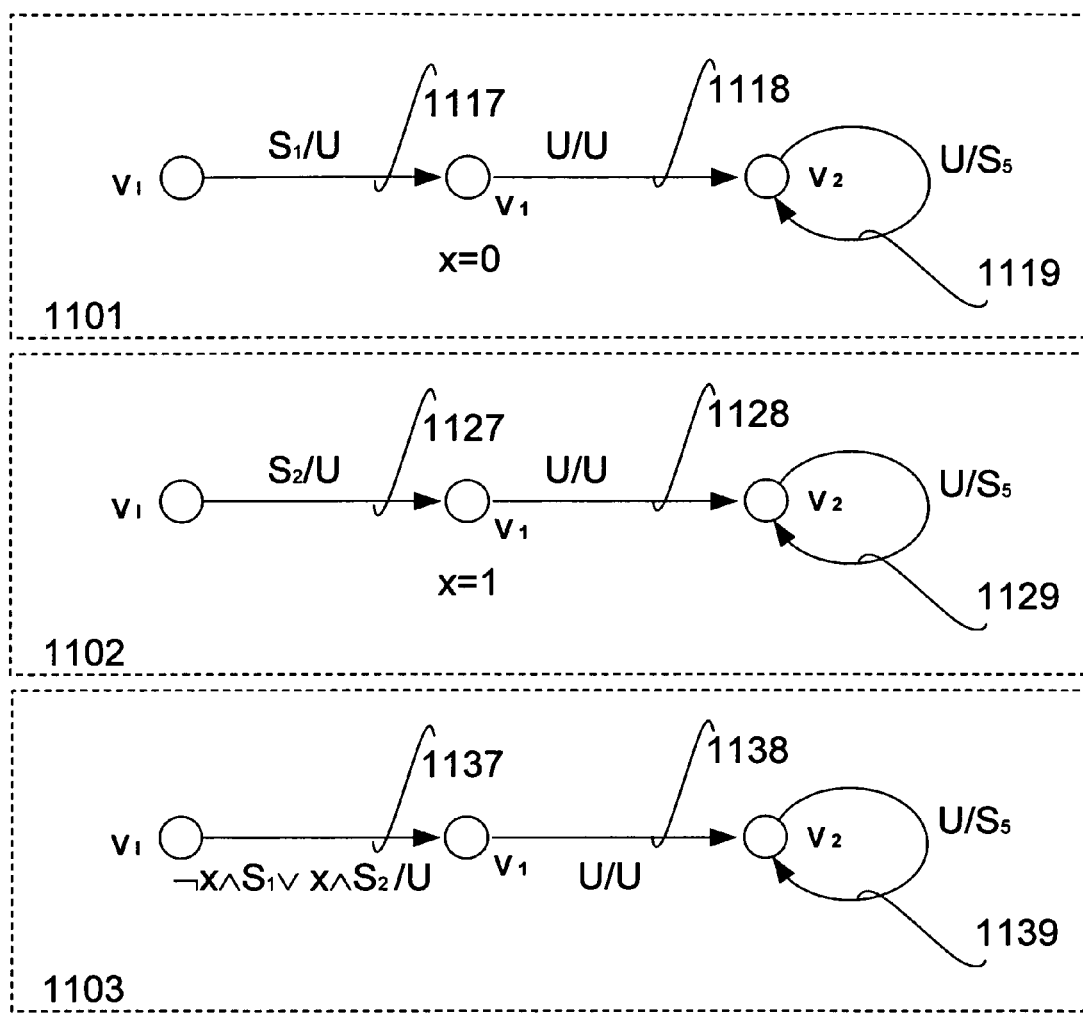
FIG. 11a shows two assertion graphs, 1101 and 1102, on a lattice domain (P, $\subseteq$) and an assertion graph 1103 on the unary symbolic lattice domain 901 that symbolically encodes assertion graphs 1101 and 1102.

For one embodiment, an assertion graph $G_S$ on a symbolic lattice domain ($\{B^m \rightarrow P\}$, $\subseteq_S$) can be set forth as a mapping $G_S(\underline{b})$ of m-ary boolean values $\underline{b}$ in $B^m$ to scalar instances of assertion graph $G_S$ on the original lattice domain (P, $\subseteq$) such that for the symbolic antecedent labeling $Ant_S$ and the symbolic consequence labeling $Cons_S$, $Ant_S(\underline{b})(e)=Ant_S(e)(\underline{b})$, and
$Cons_S(\underline{b})(e)=Cons_S(e)(\underline{b})$, for all edges e in the assertion graph $G_S$. FIG. 11a shows two assertion graphs, 1101 and 1102, on a lattice domain (P, $\subseteq$)

and an assertion graph 1103 on the unary symbolic lattice domain 901 that symbolically encodes assertion graphs 1101 and 1102. For example, edge 1137 in assertion graph 1103 encodes edge 1117 in assertion graph 1101 for x=0 and edge 1127 for x=1.

The vertices $V_S$ of an assertion graph $G_S$ on a symbolic lattice domain ($\{B^m \to P\}$, $\subseteq_S$) can be set forth as a surjective, one-to-one vertex encoding function $V_S(\underline{b})$ of m-ary boolean values $\underline{b}$ in $B^m$ to vertices $V \cup \{v_{undef}\}$ in the scalar instance $G_S(\underline{b})$ on the original lattice domain (P, $\subseteq$).

A symbolic indexing funtion for the symbolic antecedent labeling is $Ant_S(\underline{v}, \underline{v}') = OR_{for\ \underline{b},\ \underline{b}'\ in\ B^m}((\underline{v}=\underline{b})$ AND $Ant_S(V_S(\underline{b}), V_S(\underline{b}')))$, where $Ant_S(V_S(\underline{b}), v_{undef}) = Z$ for any $\underline{b}$ in $B^m$. By introducing two vertex encoding variables u1 and u2 to encode the vertices vI, v1, v2, and the undefined vertex $v_{undef}$ as ($\neg u1 \wedge \neg u2$), ($\neg u1 \wedge u2$), ($u1 \wedge u2$), and ($u1 \wedge \neg u2$) respectively, the symbolic antecedent encoding function for assertion graph 1103 becomes $$Ant_s(\underline{v}, \underline{v}') = (\neg u1 \wedge \neg u2 \wedge \neg u1' \wedge u2') \wedge (\neg x \wedge S1 \vee x \wedge S2) \vee$$
$$(\neg u1 \wedge u2 \wedge u1' \wedge u2') \wedge U \vee$$
$$(u1 \wedge u2 \wedge u1' \wedge u2') \wedge U$$
$$= (\neg u1 \wedge \neg u2 \wedge \neg u1' \wedge u2') \wedge (\neg x \wedge S1 \vee x \wedge S2) \vee (u2 \wedge u1' \wedge u2') \wedge U.$$

A symbolic indexing function for the symbolic consequence labeling is $Cons_S(\underline{v}, \underline{v}') = OR_{for\ \underline{b},\ \underline{b}'\ in\ B^m}((\underline{v}=\underline{b})$ AND $Ant_S(V_S(\underline{b}), V_S(\underline{b}')))$, where $Cons_S(V_S(\underline{b}), v_{undef}) = Z$ for any $\underline{b}$ in $B^m$. According to the two variable vertex encoding described above, the symbolic consequence encoding function for assertion graph 1103 becomes $$Cons_s(\underline{v}, \underline{v}') = (\neg u1 \wedge \neg u2 \wedge \neg u1' \wedge u2') \wedge U \vee$$
$$(\neg u1 \wedge u2 \wedge u1' \wedge u2') \wedge U \vee$$
$$(u1 \wedge u2 \wedge u1' \wedge u2') \wedge S5$$
$$= (\neg u1 \wedge u2' \wedge (\neg u2 = u1')) \wedge U \vee (u1 \wedge u2 \wedge u1' \wedge u2') \wedge S5.$$

Given a model $M_S$ on the symbolic lattice domain ($\{B^m \to P\}$, $\subseteq_S$), and an assertion graph $G_S$ on the symbolic lattice domain ($\{B^m \to P\}$, $\subseteq_S$) having edges ($\underline{v}, \underline{v}'$) and ($\underline{v}'$, $\underline{v}$) where $\underline{v}'$ denotes the successors of $\underline{v}$, and $\underline{v}^-$ denotes the predecessors of $\underline{v}$, a method to symbolically compute the simulation relation sequence of $G_S$ can be formally defined. For one embodiment, a symbolic simulation relation sequence $Sim_S(\underline{v}, \underline{v}')$ can be defined for model checking according to the strong satisfiability criteria as follows:

$Sim_{S1}(\underline{v}, \underline{v}') = (initE(\underline{v}, \underline{v}')$ AND U) $Meet_S Ant_S(\underline{v}, \underline{v}')$ where initE is a Boolean predicate for the set of edges outgoing from vI, and $Sim_{Sn}(\underline{v}, \underline{v}') = Join_S(Sim_{Sn-1}(\underline{v}, \underline{v}'), (Join_{S\ for\ all\ \underline{b}\ in\ B^m}$
$(Meets_S(Ant(\underline{v}, \underline{v}'), Post_S(Sim_{Sn-1}(\underline{v}^-, \underline{v}))))[\underline{b}/\underline{v}^-]))$, $^{for\ all\ n>}1$ where $Join_S$ and $Meet_S$ are the join, $\cup_S$, and meet, $\cap_S$, operators for the symbolic lattice domain ($\{B^m \to P\}$, $\subseteq_S$) and $[\underline{b}/\underline{v}^-]$ $^{denotes\ replacing\ each\ occurrence\ of\ \underline{v}^-}$ in the previous expression with b.

Figure 12A:
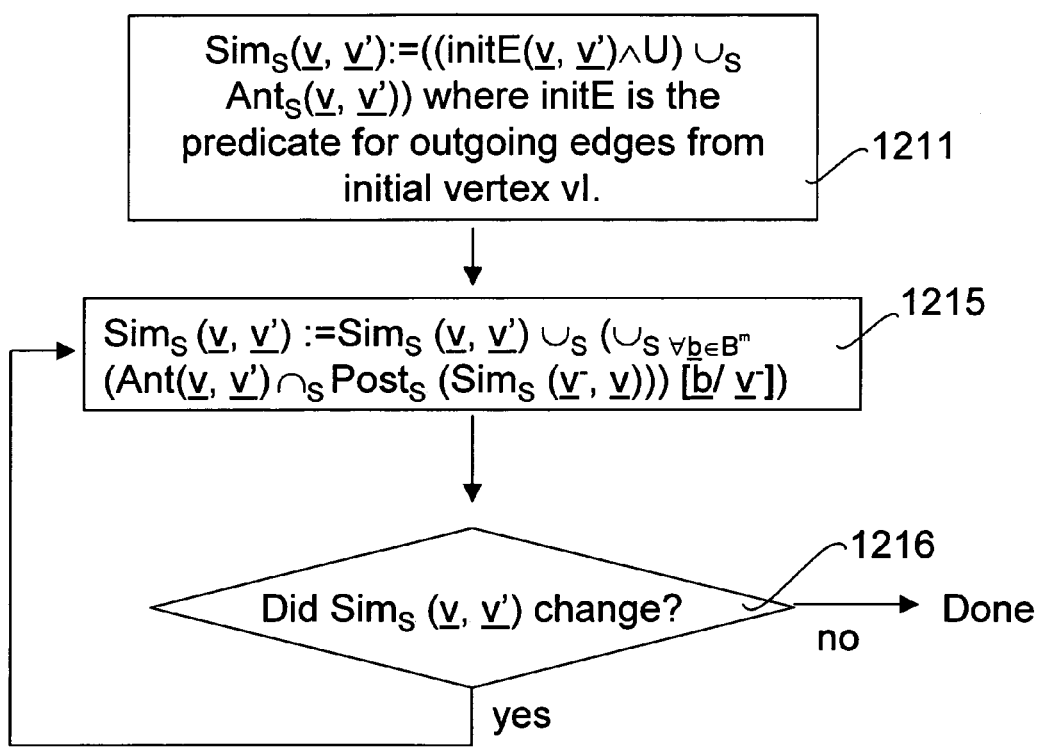
FIG. 12a illustrates for one embodiment, a method for symbolically computing a simulation relation sequence.

For one embodiment, FIG. 12a illustrates a method for computing the simulation relation for a model and an assertion graph on the symbolic lattice domain ($\{B^m \to P\}$, $\subseteq_S$) Box 1211 represents initially assigning $Z = (initE(\underline{v}, \underline{v}') \wedge U) \cap_S Ant_S(\underline{v}, \underline{v}')$ to the simulation relation for all edges ($\underline{v}, \underline{v}'$) in the assertion graph that do not begin at initial vertex vI, and initially assigning $Ant_S(\underline{v}, \underline{v}') = (initE(\underline{v}, \underline{v}') \wedge U) \cap_S Ant_S(\underline{v}, \underline{v}')$ to the simulation relation for all edges ($\underline{v}, \underline{v}'$) that do begin at initial vertex vI. Box 1215 represents recomputing the simulation relation for edge ($\underline{v}, \underline{v}'$) by adding to the simulation relation for edges ($\underline{v}, \underline{v}'$), any states which are in both the antecedent set for edges ($\underline{v}, \underline{v}'$) and the post-image set for the simulation relation of any incoming edges ($\underline{v}^-, \underline{v}$) to ($\underline{v}, \underline{v}'$) produced by substituting any $\underline{b}$ in $B^m$ for $\underline{v}^-$. Box 1216 represents testing the simulation relation labeling for edges ($\underline{v}, \underline{v}'$) to determine if it was changed by the recomputation. If it has changed, the method flow returns to the recomputation of simulation relation for edges ($\underline{v}, \underline{v}'$), represented by Box 1215. Otherwise a fixpoint has been reached and the method terminates at box 1216.

Using the method disclosed above for computing the simulation relation for a model and an assertion graph on the symbolic lattice domain ($\{B^m \to P\}$, $\subseteq_S$), the simulation relation $Sim_S(\underline{v}, \underline{v}')$ can be computed. In the first iteration the simulation relation becomes $Sim_{S1}(\underline{v}, \underline{v}) = (\neg u1 \wedge \neg u2 \wedge \neg u1' \wedge u2') \wedge (\neg x \wedge S1 \vee x \wedge S2)$.

In the second iteration the simulation relation becomes $$Sim_{S2}(\underline{v}, \underline{v}') = (\neg u1 \wedge \neg u2 \wedge \neg u1' \wedge u2') \wedge (\neg x \wedge S1 \vee x \wedge S2) \vee$$
$$(\neg u1 \wedge u2 \wedge u1' \wedge u2') \wedge (\neg x \wedge S3 \vee x \wedge S4).$$

In the third iteration the simulation relation becomes $$Sim_{S3}(\underline{v}, \underline{v}') = (\neg u1 \wedge \neg u2 \wedge \neg u1' \wedge u2') \wedge (\neg x \wedge S1 \vee x \wedge S2) \vee$$
$$(\neg u1 \wedge u2 \wedge u1' \wedge u2') \wedge (\neg x \wedge S3 \vee x \wedge S4) \vee$$
$$(u1 \wedge u2 \wedge u1' \wedge u2') \wedge S5.$$

Figure 11B:
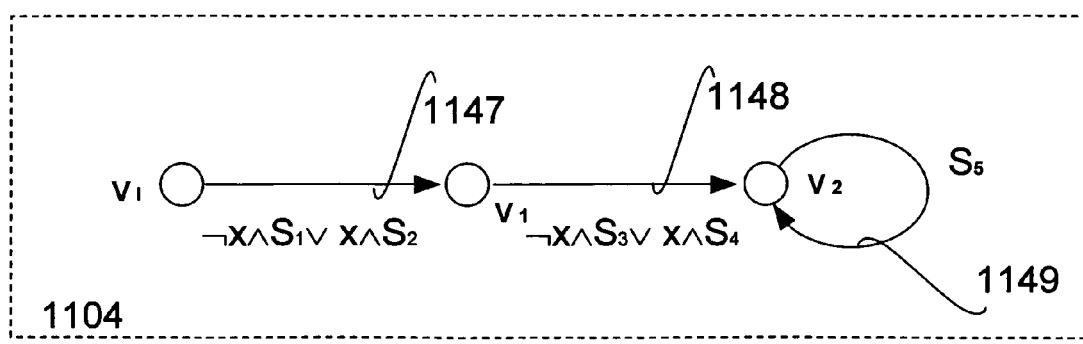
FIG. 11b shows the simulation relation of assertion graph 1103 on the unary symbolic extension of model 1001.

Finally in the fourth iteration the simulation relation becomes $Sim_{S4}(\underline{v}, \underline{v}') = Sim_{S3}(\underline{v}, \underline{v}')$ resulting in termination of the method. FIG. 11b shows the simulation relation 1004 for assertion graph 1103 on the unary symbolic extension of model 1001. For edge 1147, the fixpoint simulation relation is $Sim_S(vI, v1) = \neg x \wedge S1 \vee x \wedge S2$. For edge 1148, the fixpoint simulation relation is $Sim_S(v1, v2) = \neg x \wedge S3 \vee x \wedge S4$, and for edge 1149, the fixpoint simulation relation is $Sim_S(v2, v2) = S5$.

Comparing the simulation relation for each edge, with the consequence for that edge indicates whether the symbolic extension of model 1001 strongly satisfies assertion graph 1103. It will be appreciated that a containment comparison may be interpreted and also performed in a variety of ways, for example: by inspection to see if each element in a set Sj is also in a set Sk, or by testing if Sj intersected with Sk equals Sj, or by a computing a logical operation on Boolean expressions Sj and Sk such as $\neg Sj \vee Sk$.

Since the simulation relation label $\neg x \wedge S1 \vee x \wedge S2$ of edge 1147 is contained by the consequence label U, edge 1137 is satisfied. Since the simulation relation label $\neg x \wedge S3 \vee x \wedge S4$ of edge 1148 is contained by the consequence label U, edge 1138 is satisfied. Finally since the simulation relation label S5 of edge 1149 is contained by the consequence label S5, edge 1139 is satisfied. Therefore the final simulation relation indicates that symbolic extension of model 1001 strongly satisfies assertion graph 1103 on the symbolic lattice domain ($\{B^m \rightarrow P\}$, $\subseteq_S$). Intuitively this means that the model 1001 strongly satisfies both assertion graphs 1101 and 1102 on the lattice domain (P, $\subseteq$).

Accordingly, by applying previously disclosed methods, for example, of FIG. 6a or of FIG. 8b, symbolic model checking can be performed using the normal satisfiability criteria if a strengthened antecedent sequence can be computed symbolically.

For one embodiment, an antecedent strengthening sequence $Ant_S(\underline{v}^-, \underline{v})$ can be defined for model checking according to the normal satisfiability criteria as follows:

$Ant_{S1}(\underline{v}^-, \underline{v}) = Ant_S(\underline{v}^-, \underline{v})$, and
$Ant_{Sn}(\underline{v}^-, \underline{v}) = Meet_S(Ant_{Sn-1}(\underline{v}^-, \underline{v}), (Join_{S \text{ for all } \underline{b} \text{ in } B^m} Pre_S(Sim_{Sn-1}(\underline{v}, \underline{v}'))[b/\underline{v}']))$, for all n>1.

Figure 12B:
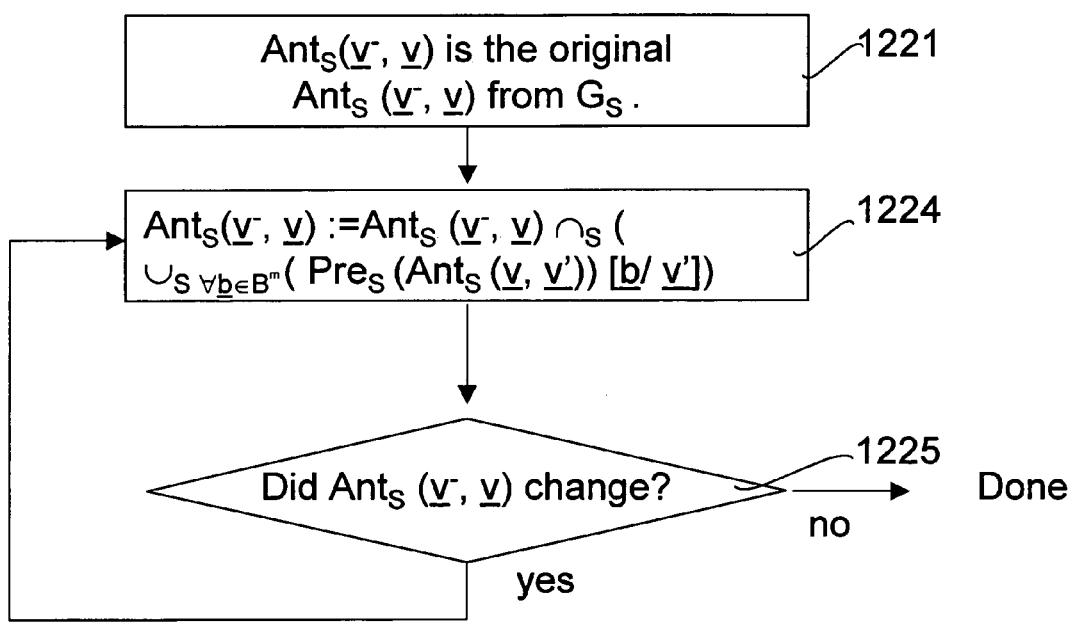
FIG. 12b illustrates for one embodiment, a method for symbolically computing an antecedent strengthening sequence.

For one embodiment, FIG. 12b illustrates a method for computing the strengthened antecedents for an assertion graph on a symbolic lattice domain. In box 1221 all edges in the assertion graph have their original antecedent label values. Box 1224 represents recomputing the symbolic antecedent label for edges ($\underline{v}^-$, $\underline{v}$), by keeping in the antecedent label for edges ($\underline{v}^-$, $\underline{v}$), any states that are already contained by the symbolic antecedent label for edges ($\underline{v}^-$, $\underline{v}$) and also contained by some pre-image set for the antecedent label of edges ($\underline{v}$, $\underline{v}'$), outgoing from ($\underline{v}^-$, $\underline{v}$) and formed by substituting any $\underline{b}$ in $B^m$ for $\underline{v}'$. Box 1225 represents testing the symbolic antecedent labeling for edges ($\underline{v}^-$, $\underline{v}$) to determine if it was changed by the recomputation. If it has changed, the method flow returns to the recomputation represented by Box 1224. Otherwise a fixpoint has been reached and the method terminates at Box 1225.

Accordingly, antecedent strengthening may be applied to symbolic model checking to provide normal satisfiability and therefore satisfiability of justification properties on the symbolic lattice domain ($\{B^m \rightarrow P\}$, $\subseteq_S$). It will be appreciated that the methods disclosed herein may be applied orthogonally in combination, thereby producing an exponential number of embodiments according to the combination of disclosed methods.

An assertion graph can be specified in an assertion graph language manually but with an assertion graph language as disclosed, it can also be derived automatically from a high level description, for example, from a register transfer language (RTL) description. Using such an assertion graph language, an assertion graph can also be derived directly from a circuit description.

Both methods for automatically deriving assertion graphs are potentially useful. For instance, if a particular RTL description and a corresponding circuit are very complex, manually generating an assertion graph may be prone to errors, but two assertion graphs could be automatically generated, one from the RTL description and one from the circuit design and the two assertion graphs can then be checked for equivalence. A more typical scenario, though, would be to automatically generate the assertion graph from an RTL description and then to drive the equivalence verification of the RTL description and the circuit description through circuit simulation as previously described.

Figure 13:
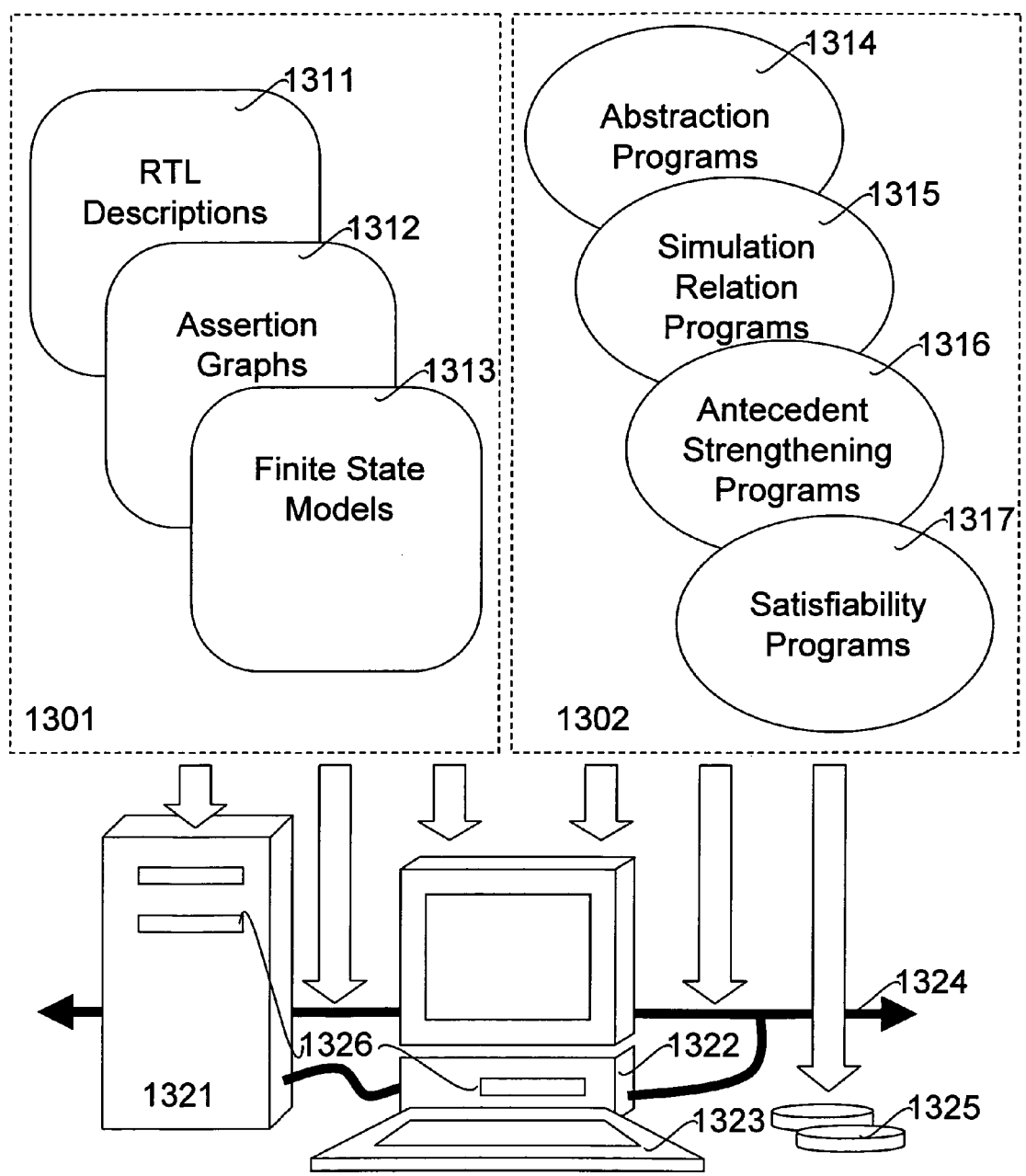
FIG. 13 depicts a computing system for automated formal verification of finite state systems.

It will also be appreciated that the methods herein disclosed or methods substantially similar to those herein disclosed may be implemented in one of many programming languages for performing automated computations including but not limited to simulation relation sequences, antecedent strengthening sequences and assertion graph satisfiability using high-speed computing devices. For example, FIG. 13 illustrates a computer system to perform computations, for one such embodiment. Computer system 1322 is connectable with various storage, transmission and I/O devices to receive data structures and programmed methods. Representative data structures 1301 may include but are not limited to RTL descriptions 1311, assertion graphs 1312, and finite state models 1313. Representative programmed methods 1302 may include but are not limited to abstraction programs 1314, simulation relation programs 1315, antecedent strengthening programs 1316, and satisfiability programs 1317. Components of either or both of the data structures and programmed methods may be stored or transmitted on devices such as removable storage disks 1325, which may be accessed through an access device 1326 in computer system 1322 or in a storage serving system 1321. Storage serving system 1321 or computer system 1322 may also include other removable storage devices or non-removable storage devices suitable for storing or transmitting data structures 1301 or programmed methods 1302. Component data structures and programmed methods may also be stored or transmitted on devices such as network 1324 for access by computer system 1322 or entered by users through I/O device 1323. It will be appreciated that systems such as the one illustrated are commonly available and widely used in the art of designing finite state hardware and software systems. It will also be appreciated that the complexity, capabilities, and physical forms of such design systems improves and changes rapidly, and therefore understood that the design system illustrated is by way of example and not limitation.

The above description is intended to illustrate preferred embodiments of the present invention. From the discussion above it should also be apparent that the invention can be modified in arrangement and detail by those skilled in the art without departing from the principles of the present invention within the scope of the accompanying claims.

What is claimed is:

1. A computer software product including one or more recordable media having executable instructions stored thereon which, when executed by a processing device, causes the processing device to strengthen a first antecedent label for an edge in an assertion graph, wherein strengthening the antecedent label comprises causing the processing device to:

join any pre-images for antecedent labels of outgoing edges from the edge in the assertion graph; and keep in the strengthened antecedent label for the edge only what is already contained by the first antecedent label for the edge and also contained by the joined pre-images for antecedent labels of outgoing edges from the edge.

2. The computer software product recited in claim 1 which, when executed by a processing device, further causes the processing device to:

compute a simulation relation for the edge from the strengthened antecedent label; and compare the simulation relation for the edge to a consequence label for the edge.

3. The computer software product recited in claim 2 wherein computing the simulation relation comprises causing the processing device to:
identify in the strengthened antecedent label of the edge any states that are also contained by a post-image for a simulation relation of an edge incoming to the edge in the assertion graph; and
join to the simulation relation for the edge, the identified states.

4. The computer software product recited in claim 2 wherein comparing the simulation relation to a consequence label comprises causing the processing device to:
determine whether the simulation relation for the edge is contained by the consequence label for the edge.

5. The computer software product recited in claim 2 wherein comparing the simulation relation to a consequence label comprises causing the processing device to:
negate a Boolean expression of the simulation relation for the edge, and:
logically combine the negated Boolean expression with a Boolean expression of the consequence label for the edge using a logical OR operation.

6. The computer software product recited in claim 2 wherein computing a simulation relation for the edge from the strengthened antecedent label comprises causing the processing device to:
compute a simulation relation abstraction for the edge; and
concretize the simulation relation abstraction for the edge to produce the simulation relation for the edge.

7. The computer software product recited in claim 6 wherein computing a simulation relation for the edge from the strengthened antecedent label further comprises causing the processing device to:
abstract the strengthened antecedent label to produce an antecedent label abstraction for the edge; and
use the antecedent label abstraction to compute the simulation relation abstraction for the edge.

8. A computer-implemented method comprising strengthening a first antecedent label for an edge in an assertion graph, wherein strengthening the antecedent label comprises:
joining pre-images of antecedent labels of any outgoing edges from the edge in the assertion graph; and
keeping, in the strengthened antecedent label for the edge, states already contained by the first antecedent label for the edge and also contained by the joined pre-images of antecedent labels of any outgoing edges from the edge.

9. The method recited in claim 8 wherein the first antecedent label is one of a plurality of antecedent labels including a second antecedent label encoded along with the first antecedent label into a third antecedent label by a symbolic indexing function.

10. The method recited in claim 8 further comprising:
computing a simulation relation for the edge from the strengthened antecedent label; and
comparing the simulation relation for the edge to a consequence label for the edge.

11. The method recited in claim 10 wherein comparing the simulation relation to a consequence label comprises:
determining whether the simulation relation for the edge is contained by the consequence label for the edge.

12. The method recited in claim 10 wherein comparing the simulation relation to a consequence label comprises:
negating a Boolean expression of the simulation relation for the edge, and:
logically combining the negated Boolean expression with a Boolean expression of the consequence label for the edge using a logical OR operation.

13. A verification system comprising means for strengthening a first antecedent label for an edge in an assertion graph, wherein the means for strengthening the antecedent label comprises:
means for joining any pre-images for antecedent labels of outgoing edges from the edge in the assertion graph; and
means for keeping, in the strengthened antecedent label for the edge, states already contained by the first antecedent label for the edge and also contained by the joined pre-images for antecedent labels of outgoing edges from the edge.

14. The verification system of claim 13 wherein the first antecedent label is one of a plurality of antecedent labels including a second antecedent label encoded along with the first antecedent label into a third antecedent label by a symbolic indexing function.

15. The verification system of claim 13 further comprising:
means for computing a simulation relation for the edge from the strengthened antecedent label; and
means for comparing the second simulation relation for the edge with a consequence label for a corresponding edge in a second assertion graph to check if the second simulation relation is contained by the consequence label.

16. The verification system of claim 15 wherein the means for comparing the simulation relation to a consequence label comprises:
means for determining whether the simulation relation for the edge is contained by the consequence label for the edge.

17. A verification system comprising:
a recordable medium to store executable instructions;
a processing device to execute instructions; and
a plurality of executable instructions that when executed by the processing device, cause the processing device to:
strengthen an antecedent label for an edge in an assertion graph;
compute a first simulation relation for the edge; and
concretize the first simulation relation computed for the edge to produce a second simulation relation for the edge.

18. The verification system of claim 17 wherein the plurality of executable instructions, when executed by the processing device, further cause the processing device to:
compute a first simulation relation using the strengthened antecedent label; and
verify a justification property of the assertion graph from the first simulation relation.

19. A verification system comprising:
a recordable medium to store executable instructions;
a processing device to execute instructions; and
a plurality of executable instructions that when executed by the processing device, cause the processing device to strengthen one or more antecedents representing pre-existing states and stimuli for an assertion, and to verify a justification property of the assertion using the one or more strengthened antecedent.

20. The verification system of claim 19, wherein the one or more antecedents are strengthened by propagating future antecedents backwards.

21. The verification system of claim 19, wherein the justification property is verified by computing a simulation relation using the one or more strengthened antecedents and comparing the simulation relation to one or more consequences representing possible resulting states for the assertion.

22. A computer-implemented method comprising:
expressing a justification property with an assertion having at least one antecedent to represent preexisting states and stimuli for a finite state machine, and also having at least one consequence to represent possible resulting states for the finite state machine;
strengthening said at least one antecedent of the assertion, and
verifying said justification property using the at least one strengthened antecedent and said at least one consequence.

23. The method of claim 22, wherein the justification property is verified by computing a simulation relation sequence using the at least one strengthened antecedent and comparing the simulation relation sequence at least in part to said at least one consequence.

24. The method of claim 22, said verification of the justification property comprising:
computing a simulation relation abstraction for the assertion; and
concretizing the simulation relation abstraction to produce the simulation relation for the assertion.

25. The method of claim 24, wherein the justification property is verified by comparing the simulation relation at least in part to said at least one consequence.

* * * * *